US011723218B2

(12) United States Patent
Lin et al.

(10) Patent No.: US 11,723,218 B2
(45) Date of Patent: Aug. 8, 2023

(54) SEMICONDUCTOR DEVICE AND METHOD FOR FORMING THE SAME

(71) Applicant: Taiwan Semiconductor Manufacturing Co., Ltd., Hsinchu (TW)

(72) Inventors: Shy-Jay Lin, Jhudong Township (TW); Chien-Min Lee, Hsinchu (TW); Hiroki Noguchi, Hsinchu (TW); Mingyuan Song, Hsinchu (TW); Yen-Lin Huang, Hsinchu (TW); William Joseph Gallagher, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 101 days.

(21) Appl. No.: 17/216,162

(22) Filed: Mar. 29, 2021

(65) Prior Publication Data

US 2021/0408115 A1    Dec. 30, 2021

Related U.S. Application Data

(60) Provisional application No. 63/045,285, filed on Jun. 29, 2020.

(51) Int. Cl.
*H01L 21/00* (2006.01)
*H10B 61/00* (2023.01)
(Continued)

(52) U.S. Cl.
CPC ....... *H10B 61/22* (2023.02); *H01L 21/76898* (2013.01); *H01L 21/823475* (2013.01); *H01L 23/528* (2013.01)

(58) Field of Classification Search
CPC ............ H01L 27/228; H01L 21/76898; H01L 21/823475; H10B 61/22
See application file for complete search history.

(56) References Cited

U.S. PATENT DOCUMENTS 7,816,231 B2 * 10/2010 Dyer .................... H01L 23/544
                                                    438/675
7,915,658 B2 *  3/2011 Pellela ................ H01L 27/0255
                                                   257/E21.364

(Continued)

FOREIGN PATENT DOCUMENTS

DE    102021108348 A1 * 12/2021    ....... H01L 21/76898
KR    20150089045 A    8/2015
(Continued)

*Primary Examiner* — Laura M Menz
(74) *Attorney, Agent, or Firm* — Slater Matsil, LLP

(57) ABSTRACT

A device includes a substrate having a first side and a second side, a first transistor that includes a first gate over a first protrusion and a first source region and a first drain region interposing the first protrusion, a first buried contact disposed adjacent to the first protrusion and having at least a portion extending into the substrate, a first contact plug disposed over the first drain region, first conductive lines disposed over the first contact plug and electrically connecting to the first drain region by the first contact plug, first via penetrating through the substrate and connecting the first buried contact; and second conductive lines disposed over the second side of the substrate and electrically connecting to the first via. The first buried contact is electrically connecting to the first source region or the first gate.

20 Claims, 43 Drawing Sheets

(51) Int. Cl.
    *H01L 23/528*     (2006.01)
    *H01L 21/768*     (2006.01)
    *H01L 21/8234*     (2006.01)

(56) References Cited

U.S. PATENT DOCUMENTS

| | | | |
|---|---|---|---|
| 9,542,987 B2* | 1/2017 | Naik | H10N 50/80 |
| 10,734,412 B2 | 8/2020 | Glass et al. | |
| 11,004,855 B2 | 5/2021 | Wang et al. | |
| 11,018,260 B2* | 5/2021 | Chang | H01L 21/823431 |
| 11,296,147 B2* | 4/2022 | Chiu | H10N 70/826 |
| 11,430,832 B2* | 8/2022 | Lin | H10N 50/10 |
| 11,469,221 B2* | 10/2022 | Wang | H01L 23/5286 |
| 11,469,268 B2* | 10/2022 | Lee | H10B 61/20 |
| 11,482,285 B2* | 10/2022 | Kim | H01L 29/4236 |
| 11,502,128 B2* | 11/2022 | Wu | H10B 63/84 |
| 11,532,752 B2* | 12/2022 | Chang | H10B 20/20 |
| 2008/0054313 A1 | 3/2008 | Dyer et al. | |
| 2008/0217782 A1* | 9/2008 | Frank | H01L 21/76898 438/456 |
| 2010/0238707 A1* | 9/2010 | Tsuchida | G11C 11/1675 365/189.14 |
| 2014/0145264 A1* | 5/2014 | Frank | H01L 21/76898 438/151 |
| 2014/0367777 A1* | 12/2014 | Huang | H01L 29/7816 438/459 |
| 2015/0061054 A1 | 3/2015 | Kim et al. | |
| 2015/0102395 A1 | 4/2015 | Park et al. | |
| 2015/0303200 A1* | 10/2015 | Yuki | H01L 29/0649 257/296 |
| 2015/0368095 A1* | 12/2015 | Huang | H01L 21/76224 438/48 |
| 2016/0225423 A1* | 8/2016 | Naik | G11C 11/18 |
| 2016/0225429 A1* | 8/2016 | Toh | G11C 11/1659 |
| 2016/0225819 A1* | 8/2016 | Toh | G11C 11/161 |
| 2016/0322090 A1* | 11/2016 | Chan | H10B 61/20 |
| 2017/0141158 A1* | 5/2017 | Daibou | G11C 11/161 |
| 2018/0358555 A1 | 12/2018 | Lee et al. | |
| 2019/0081102 A1 | 3/2019 | Park et al. | |
| 2019/0164882 A1 | 5/2019 | Chen et al. | |
| 2020/0357466 A1* | 11/2020 | Kim | H10B 99/00 |
| 2020/0365655 A1* | 11/2020 | Chiu | H10N 70/066 |
| 2021/0134882 A1* | 5/2021 | Lin | H01L 29/7851 |
| 2021/0257495 A1* | 8/2021 | Chang | H01L 27/0886 |
| 2021/0359199 A1* | 11/2021 | Lin | H10N 52/01 |
| 2021/0399052 A1* | 12/2021 | Wu | G11C 8/14 |
| 2021/0408115 A1* | 12/2021 | Lin | H01L 23/528 |
| 2022/0052115 A1* | 2/2022 | Wang | H01L 29/66666 |
| 2022/0223651 A1* | 7/2022 | Chiu | H10N 70/826 |
| 2022/0223785 A1* | 7/2022 | Lee | H10N 50/80 |
| 2022/0336742 A1* | 10/2022 | Lee | H10B 63/24 |
| 2022/0359613 A1* | 11/2022 | Lin | H10B 61/22 |
| 2022/0367566 A1* | 11/2022 | Diaz | H10B 61/20 |

FOREIGN PATENT DOCUMENTS

| | | | | |
|---|---|---|---|---|
| KR | 20190015269 A | | 2/2019 | |
| KR | 20190024538 A | | 3/2019 | |
| TW | 202201824 A | * | 1/2022 | ....... H01L 21/76898 |
| WO | WO-2017160311 A1 | * | 9/2017 | ............. G11C 11/16 |
| WO | WO-2019049498 A1 | * | 3/2019 | ..... H01L 21/823475 |

\* cited by examiner

SEMICONDUCTOR DEVICE AND METHOD FOR FORMING THE SAME

PRIORITY

This application claims priority to U.S. Provisional Patent Application No. 63/045,285 filed Jun. 29, 2020, and entitled "SOT MRAM with Alternative Power Rails," which application is incorporated herein by reference.

BACKGROUND

Semiconductor memories are used in integrated circuits for electronic applications, including cell phones and personal computing devices, as examples. One type of semiconductor memory device is Magneto-Resistive Random Access Memory (MRAM), which involves spin electronics, that combines semiconductor technology and magnetic materials and devices. The spins of electrons, through their magnetic moments, rather than the charge of the electrons, are used to store bit values.

Conventional MRAM cells are Spin-Transfer Torque (STT) MRAM cells. A typical STT-MRAM cell may include a Magnetic Tunnel Junction (MTJ) stack, which includes a pinning layer, a pinned layer over the pinning layer, a tunnel layer over the pinned layer, and a free layer over the tunnel layer. During the formation of the MRAM cell, multiple blanket layers are deposited first. The blanket layers are then patterned through a photolithography and etching process to form the MTJ stack.

The STT-MRAM cells suffer from a reliability problem because programming currents have to pass through the tunnel layer, and hence degrade or damage the tunnel layer. Accordingly, Spin Orbit Torque (SOT) MRAM was developed. In the programming of the SOT-MRAM cells, the programming current does not pass through the tunnel layer, and thus the reliability of the SOT-MRAM is improved over the STT-MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-14A, 1B-14B, 12C, 14C, 15-26 illustrate the cross-sectional views and plan views of intermediate stages in the formation of a semiconductor device in accordance with some embodiments.

DETAILED DESCRIPTION

Figure 1A:
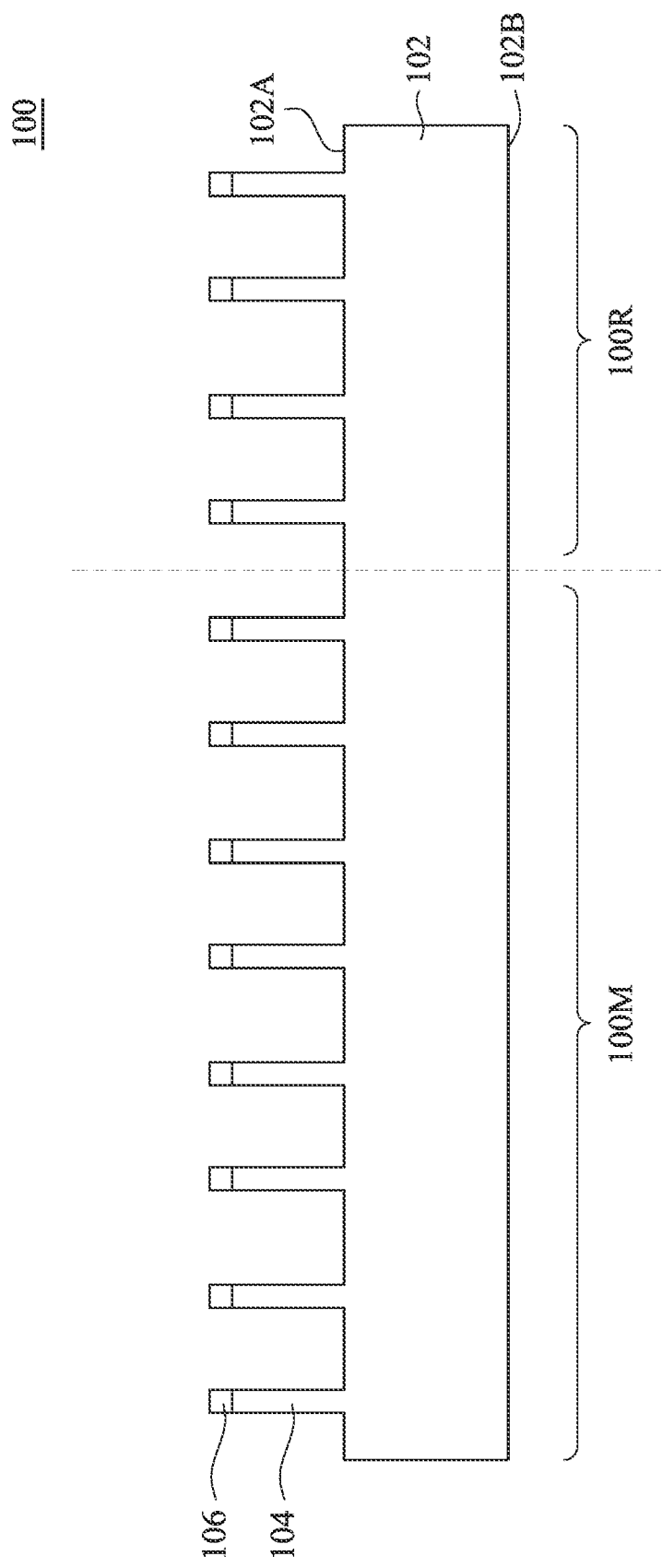

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A to 14A, 1B to 14B, 12C, 14C, and 15 to 30 are exemplary cross-sectional views and plan views of intermediate stages in the formation of semiconductor devices in accordance with various embodiments of the present disclosure. The cross-sectional views in FIGS. 1A to 14A correspond to a cross-section of the plan view shown in FIGS. 12C, 14C, and 15, such as example the cross-section A-A labeled in FIG. 12C. The cross-sectional views in FIGS. 1B to 14B correspond to a cross-section of the plan view shown in FIGS. 12C, 14C, and 15, such as example the cross-section B-B labeled in FIG. 12C. The cross-sectional views in FIGS. 16 to 24, 26, and 30 correspond to a cross-section of the plan view shown in FIG. 15, such as example the cross-section C-C labeled in FIG. 15. The cross-sectional view in FIG. 27 corresponds to a cross-section of the plan view shown in FIG. 28, such as example the cross-section C-C labeled in FIG. 28. FIGS. 25 and 29 corresponds to a cross-section of the plan view shown in FIGS. 15 and 28, such as example the cross-section D-D labeled in FIGS. 15.

Figure 24:
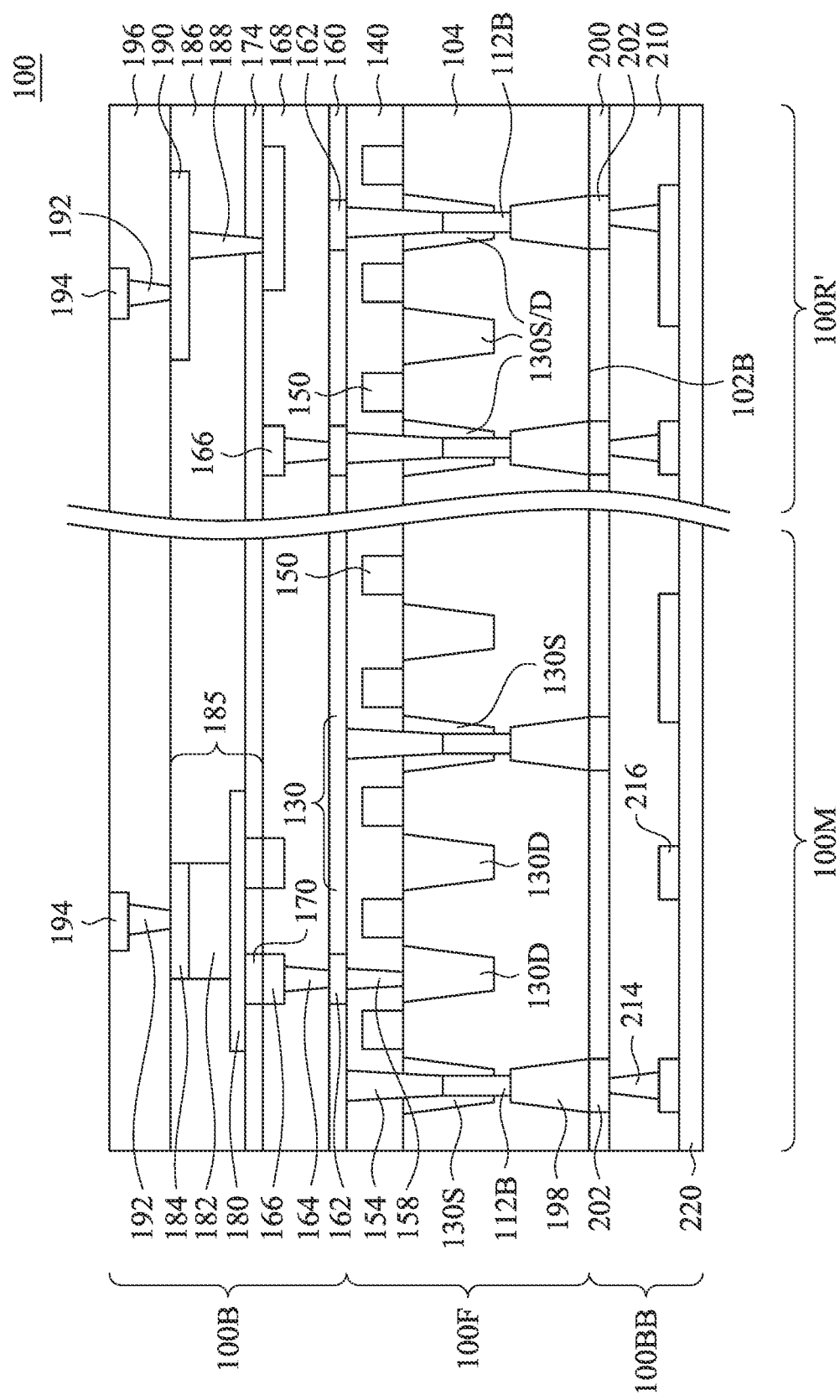
Figure 25:
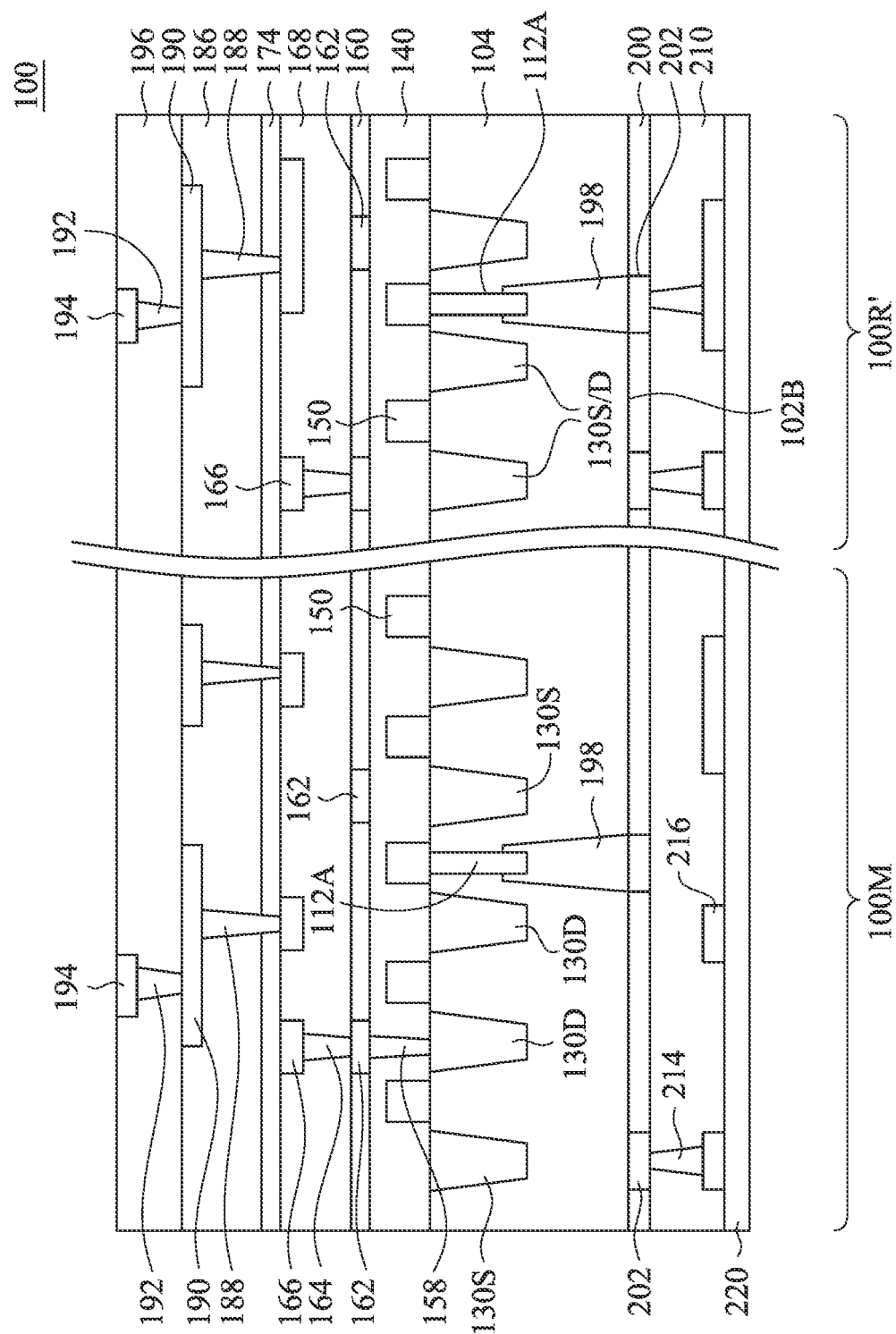

Referring to FIG. 24, in some embodiments, the semiconductor device 100 includes a front end of line (FEOL) portion 100F and a back end of line (BEOL) portion 100B disposed over a side of the FEOL portion 100F. The semiconductor device 100 also includes a backside BEOL portion 100BB disposed over the other side of the FEOL portion 100F.

The semiconductor device 100 may include various regions for disposing of various kinds of devices. In some embodiments, the semiconductor device 100 includes a cell region for a memory device, a logic region for logic circuits, routing regions for serving vertical routings, regions for other functional circuits, or a combination thereof. For example, referring to FIGS. 15 and 24, the semiconductor device 100 may include a memory device that includes multiple memory cells 101 arranged in an array within a cell region 100M. Each cell 101 of the memory device includes a memory stack 185 disposed in the BEOL portion 100B in accordance with some embodiments. Each of the memory stacks 185 may be electrically connected to one or more transistors 130 disposed in the FEOL portion 100F within the cell region 100M. Each memory stack 185 may store a single bit, which may be read or written. In some embodiments, the transistors 130 are fin field-Effect transistors (FinFETs) or gate-all-around field-effect transistors (GAAFETs).

Figure 15:
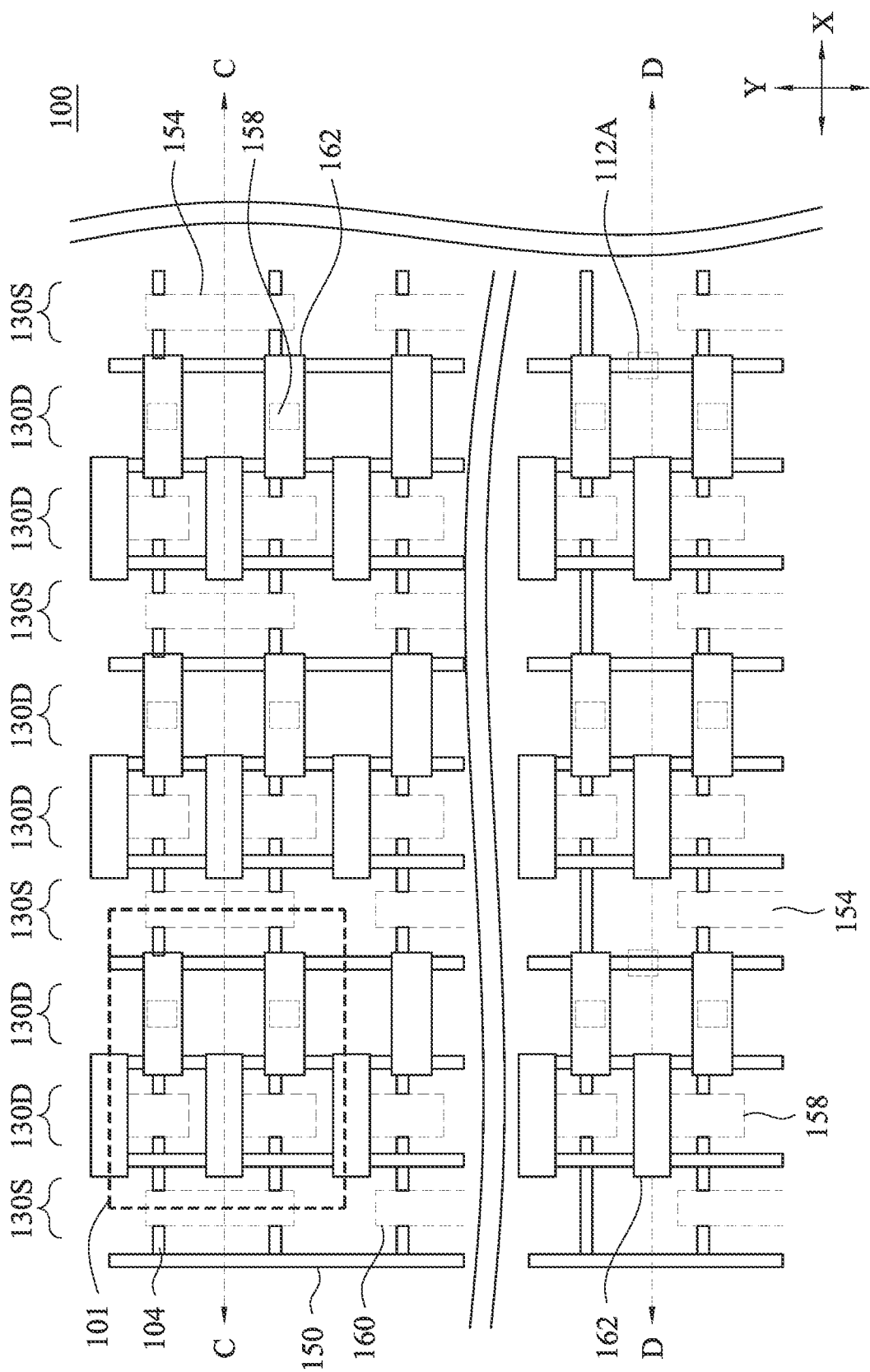

In some embodiments, a routing region 100R is formed adjacent to the cell region 100M in the Y-direction as illustrated in FIG. 15. Alternatively, a routing region 100R' (e.g., referring to FIG. 24) may be formed adjacent to the cell region 100M in a direction perpendicular to the Y-direction (for example, the X-direction as illustrated in FIG. 15). In some embodiments, the routing region 100R and the routing region 100R' are connected. The routing regions 100R and 100R' provide vertical routings for making electrical connection between the BEOL portion 100B and the backside BEOL portion 100BB. However, in accordance with some embodiments, the routing regions 100R and 100R' are omitted, and the vertical routings are integrated into any regions of the semiconductor device 100, such as the cell region 100M and/or the logic regions.

Figure 1B:
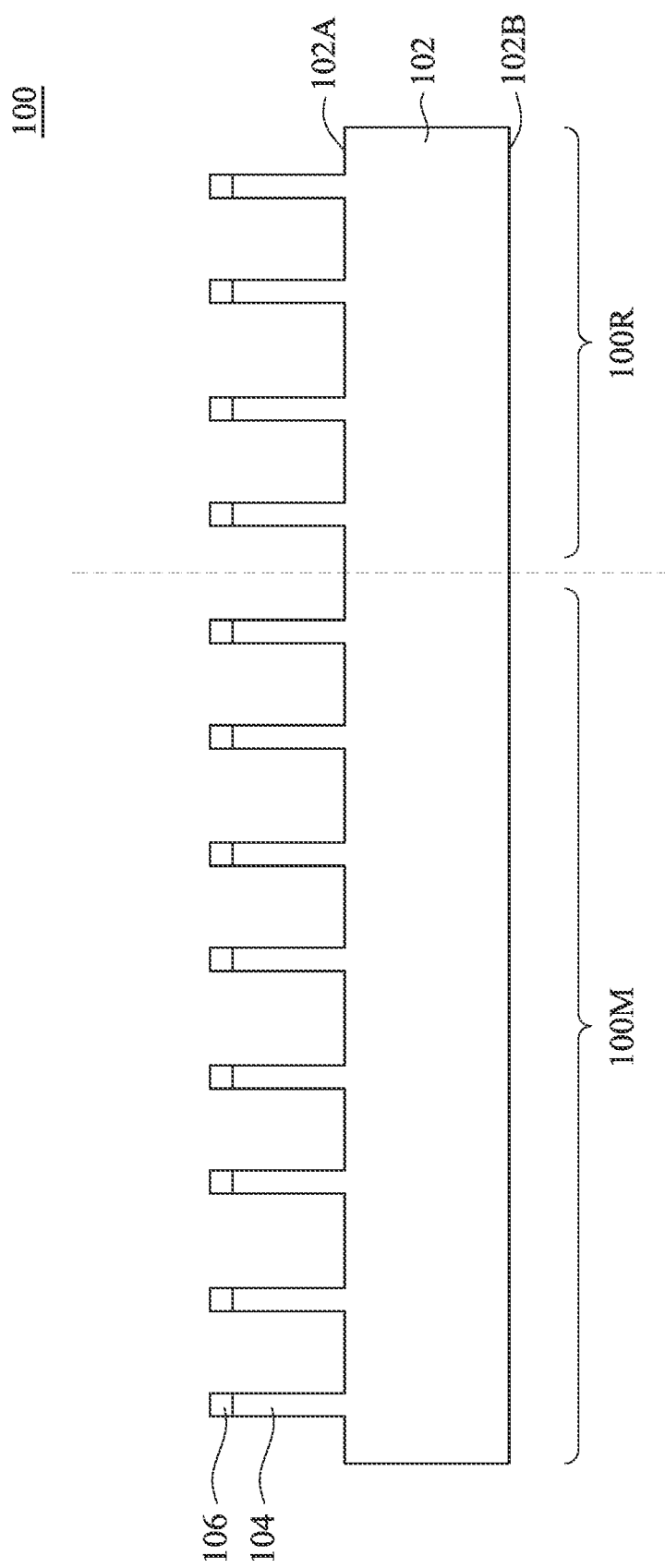
Figure 12A:
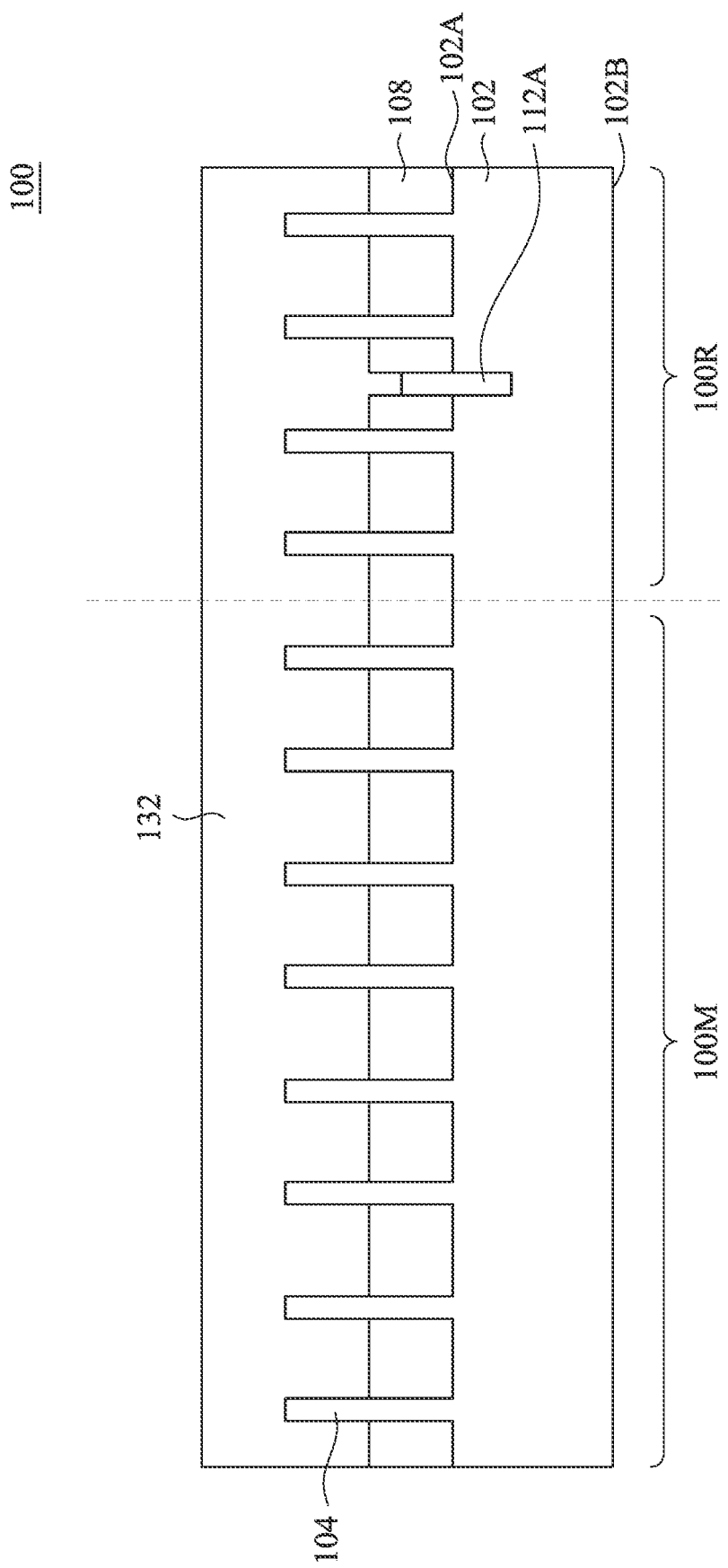
Figure 12B:
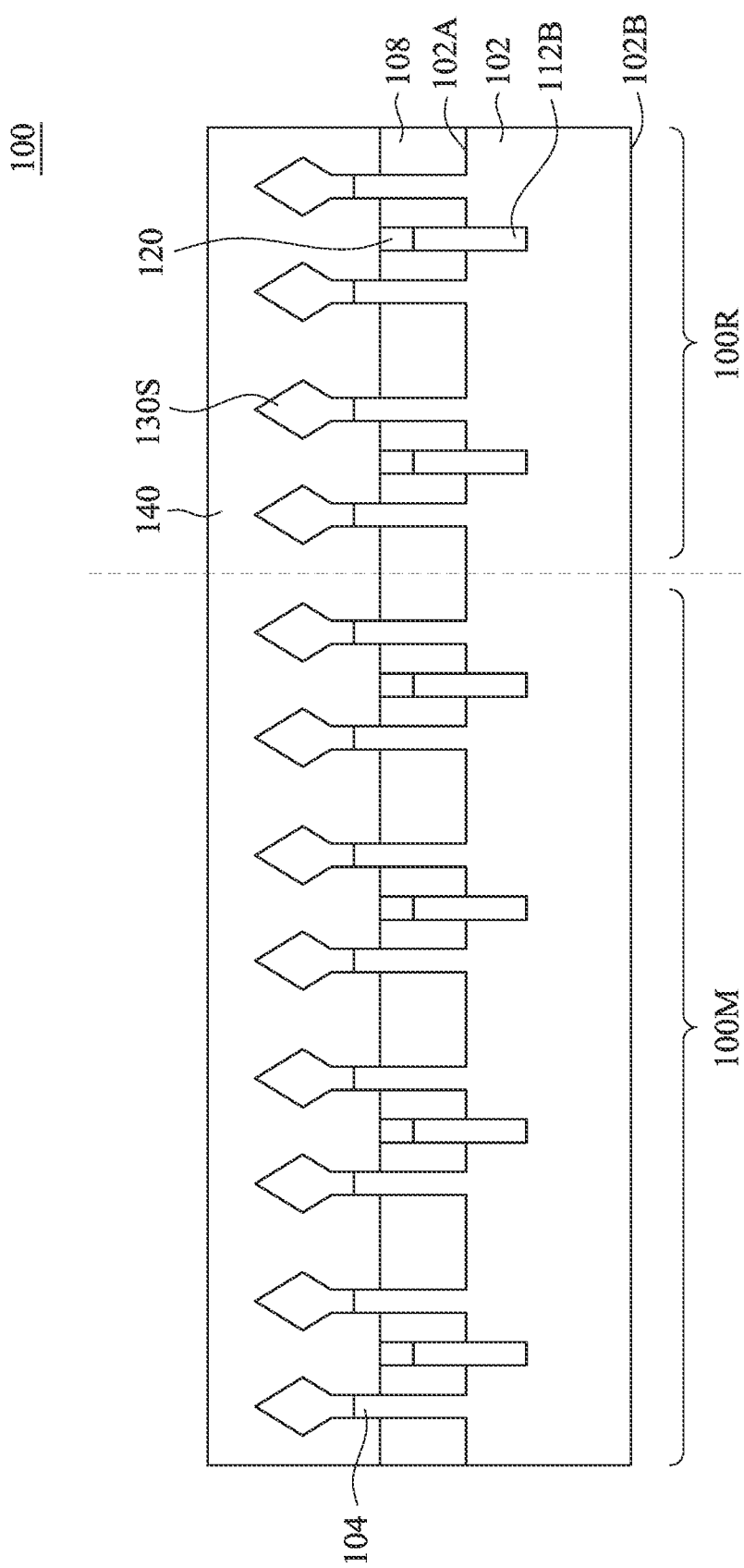
Figure 12C:
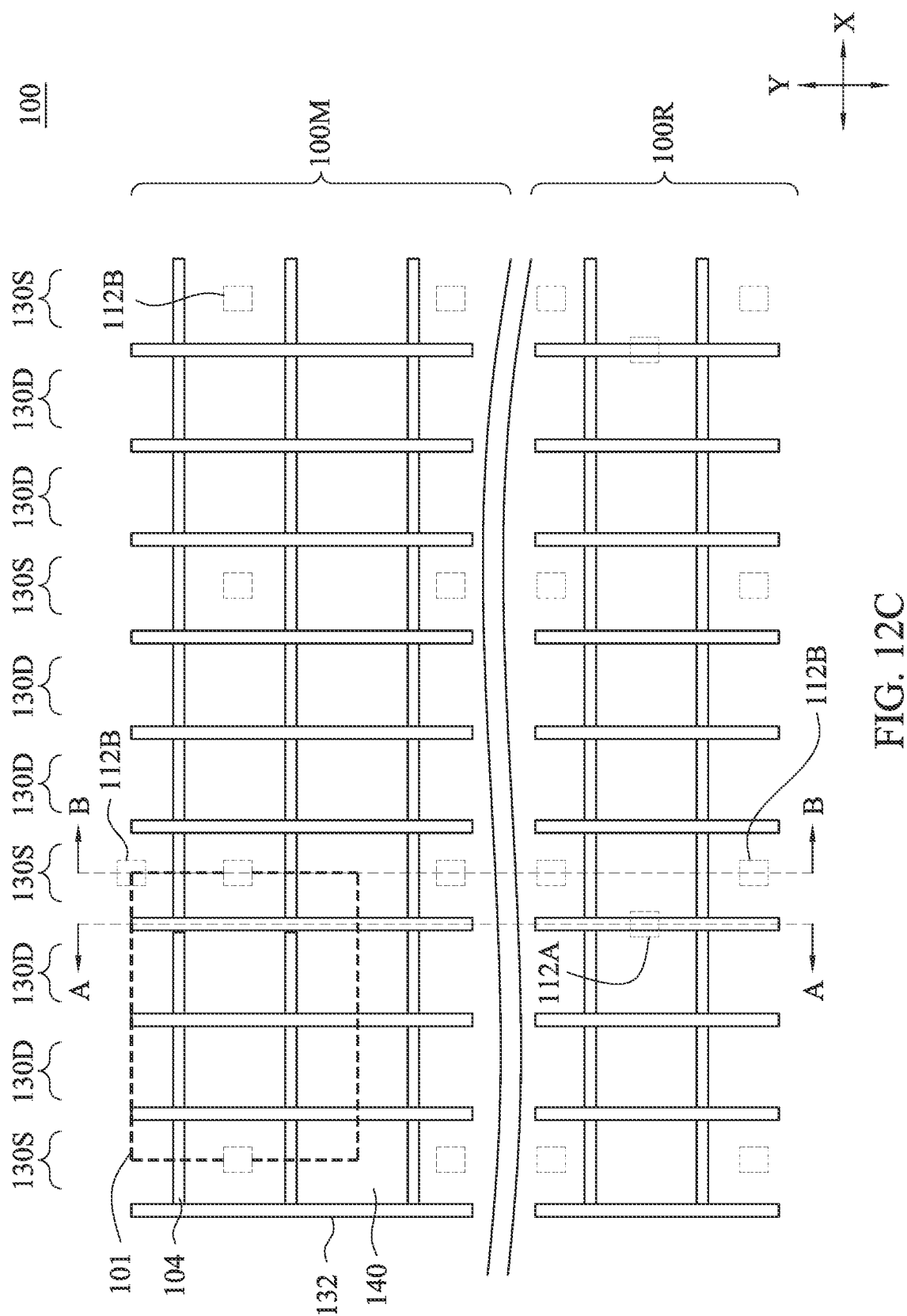

Turning to FIGS. 1A and 1B and FIG. 12C, intermediate stages in the formation of the semiconductor device 100 are illustrated. Substrate 102 includes a first side 102A and a second side 102B opposite to the first side 102A. The substrate 102 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

Multiple protrusions 104 are formed over the first side 102A of the substrate 102 in accordance with some embodiments. The protrusions 104 may include fins or stacks of laterally extended nanowires. The protrusions 104 extend along with the X-direction as illustrated in FIG. 12C. A mask layer 106 is formed over the protrusions 104 in accordance with some embodiments. The mask layer 106 may help to define patterns of the protrusions 104 and protect the protrusions 104 from being damaged in subsequent processes. In some embodiments, the mask layer 106 includes a pad layer and a hard mask over the pad layer. The pad layer may include an oxide such as silicon oxide. The hard mask may include a nitride such as silicon nitride, aluminum nitride, or a combination thereof. The protrusions 104 may be formed from the substrate 102 or by epitaxial depositing. For example, the protrusions 104 have the same material as the substrate 102 in accordance with some embodiments. However, in other embodiments, the protrusions 104 have a material different from the substrate 102.

Figure 2A:
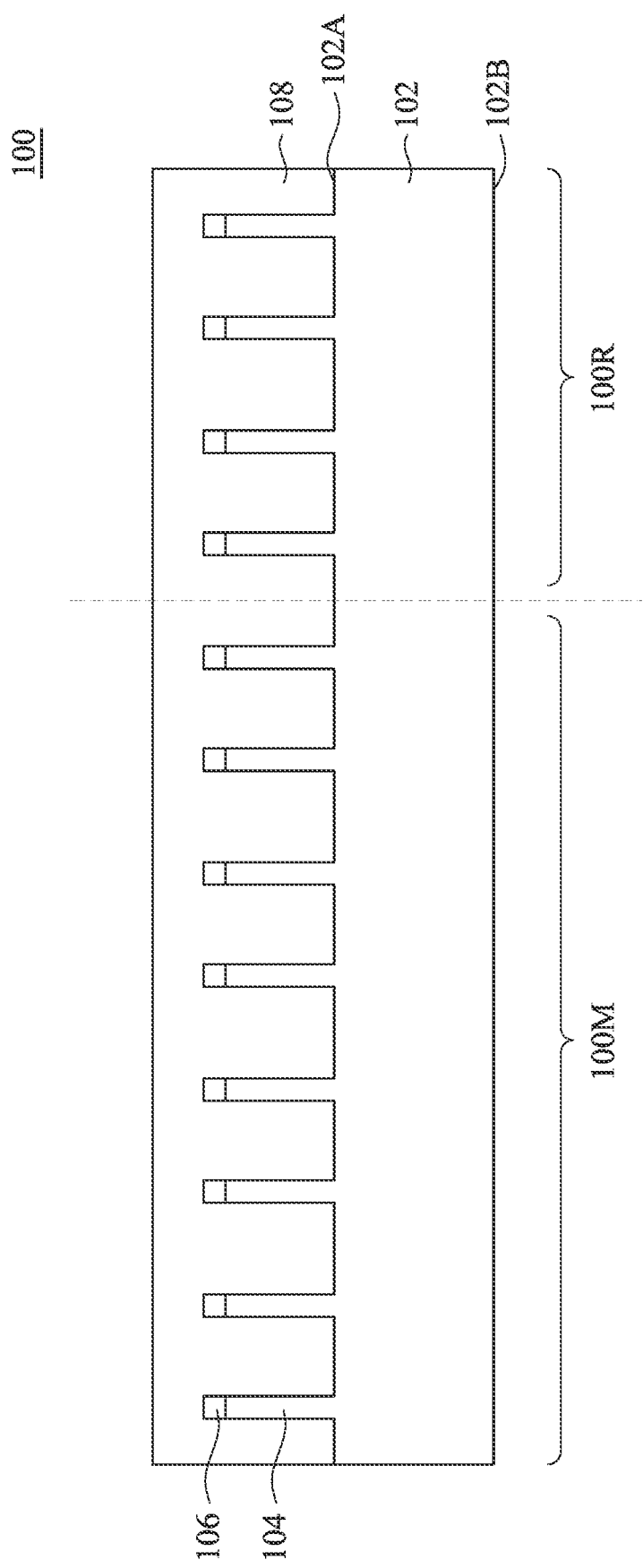
Figure 2B:
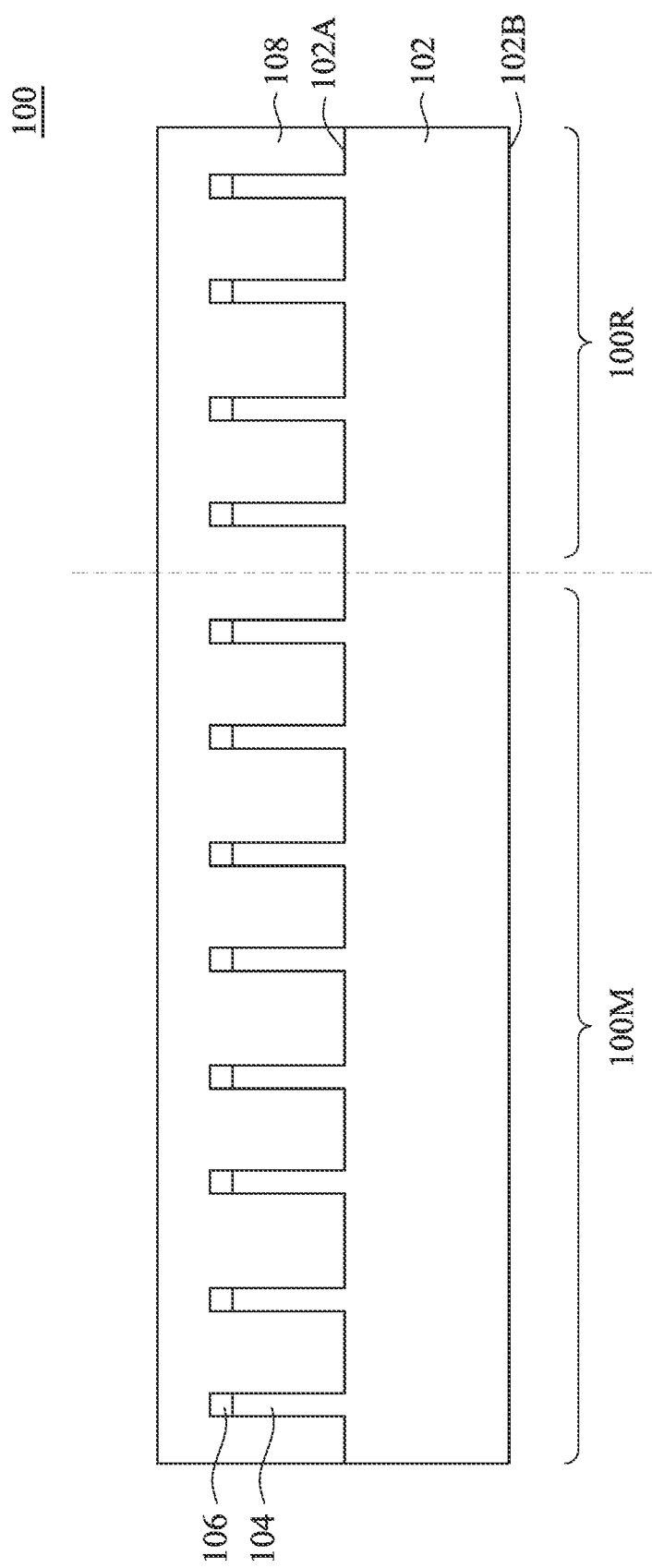

In FIGS. 2A and 2B, an insulating layer 108 is formed between neighboring protrusions 104 and covers the mask layer 106 and the protrusions 104 in accordance with some embodiments. In some embodiments, the insulating layer 108 includes a multi-layer structure, such as having isolation features disposed over one or more liners. The one or more liners may be formed over the sidewalls of the protrusions 104 and the upper surface of the first side 102A of the substrate 102. In some embodiments, the liners include silicon oxide, silicon nitride, silicon oxynitride, or a combination thereof. The isolation features may include silicon oxide, silicon oxynitride, a spin-on dielectric material, or a low-k dielectric such as porous silicon oxide or other suitable dielectric materials having a dielectric constant lower than 3.9. The isolation features may be formed by flowable CVD (FCVD) (e.g., a CVD-based material deposition in a remote plasma system and post curing to make it convert to another material, such as an oxide), high-density plasma chemical vapor deposition (HDP-CVD), sub-atmospheric CVD (SACVD), or by spin on.

Figure 3A:
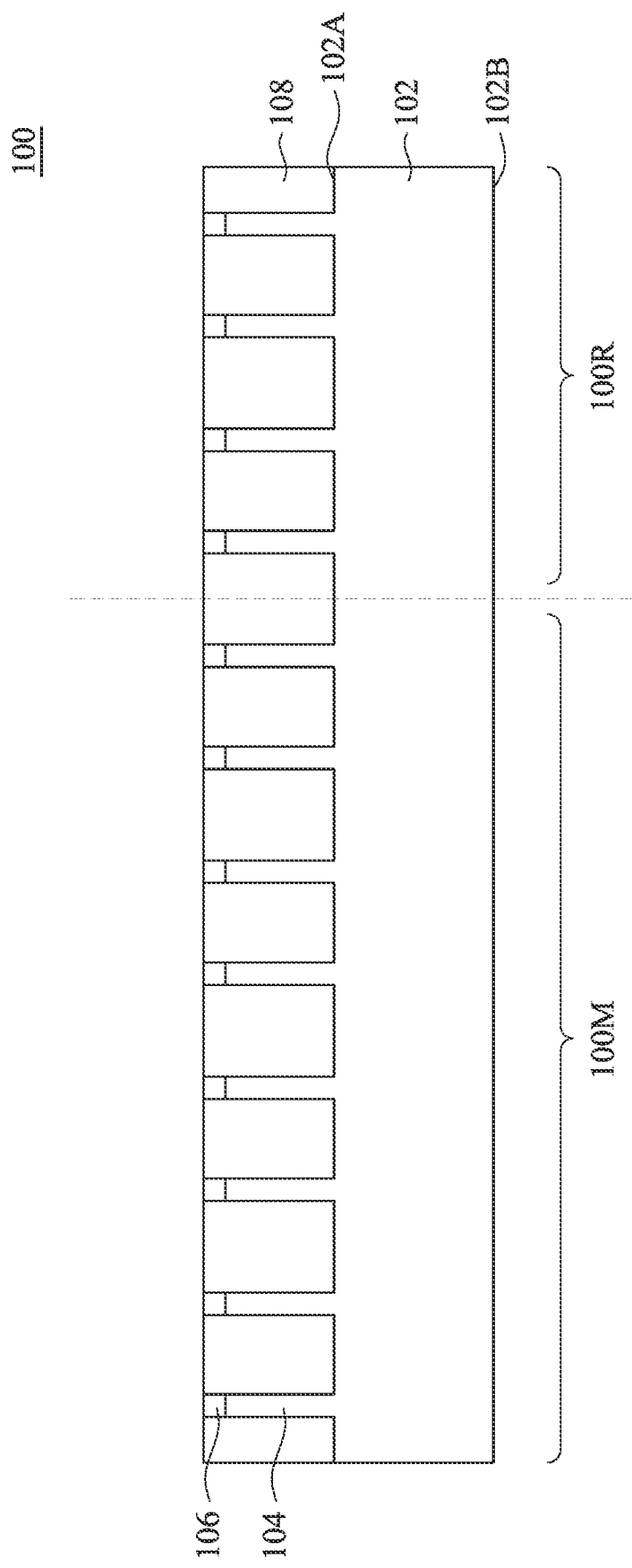
Figure 3B:
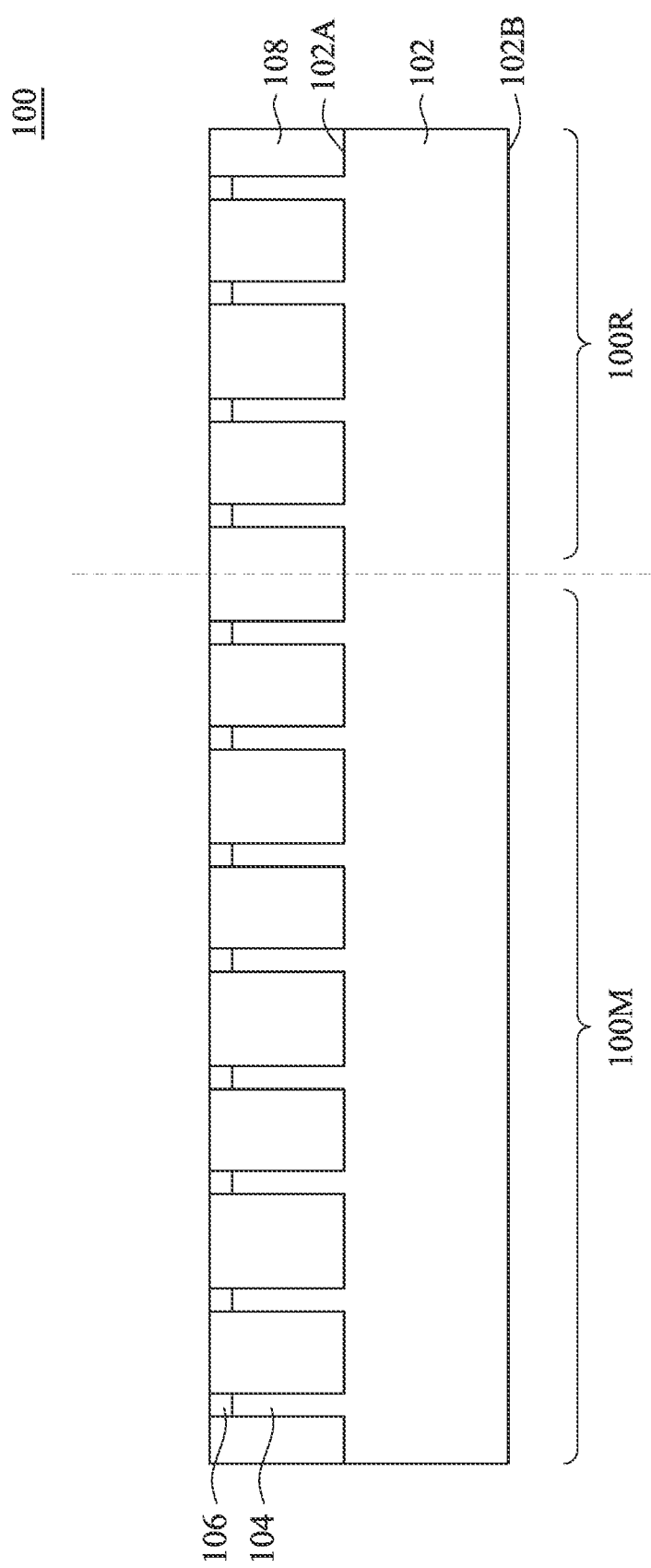

Turning to FIGS. 3A and 3B, a polishing process such as chemical mechanical polish (CMP) is performed to remove a portion of the insulating layer 108 in accordance with some embodiments. The polishing process may be performed using the mask layer 106 as an etching stop. In some embodiments, this polishing process is omitted.

Figure 4A:
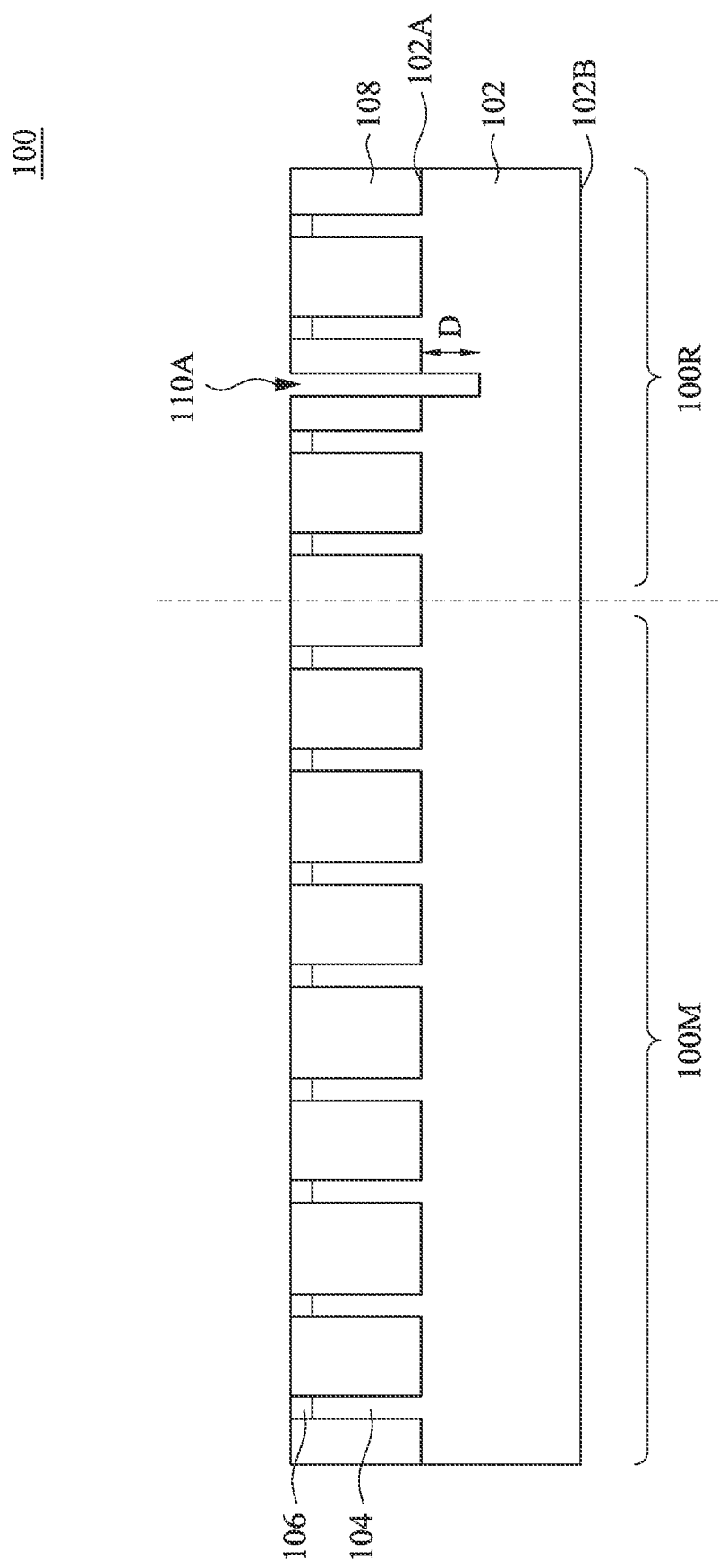
Figure 4B:
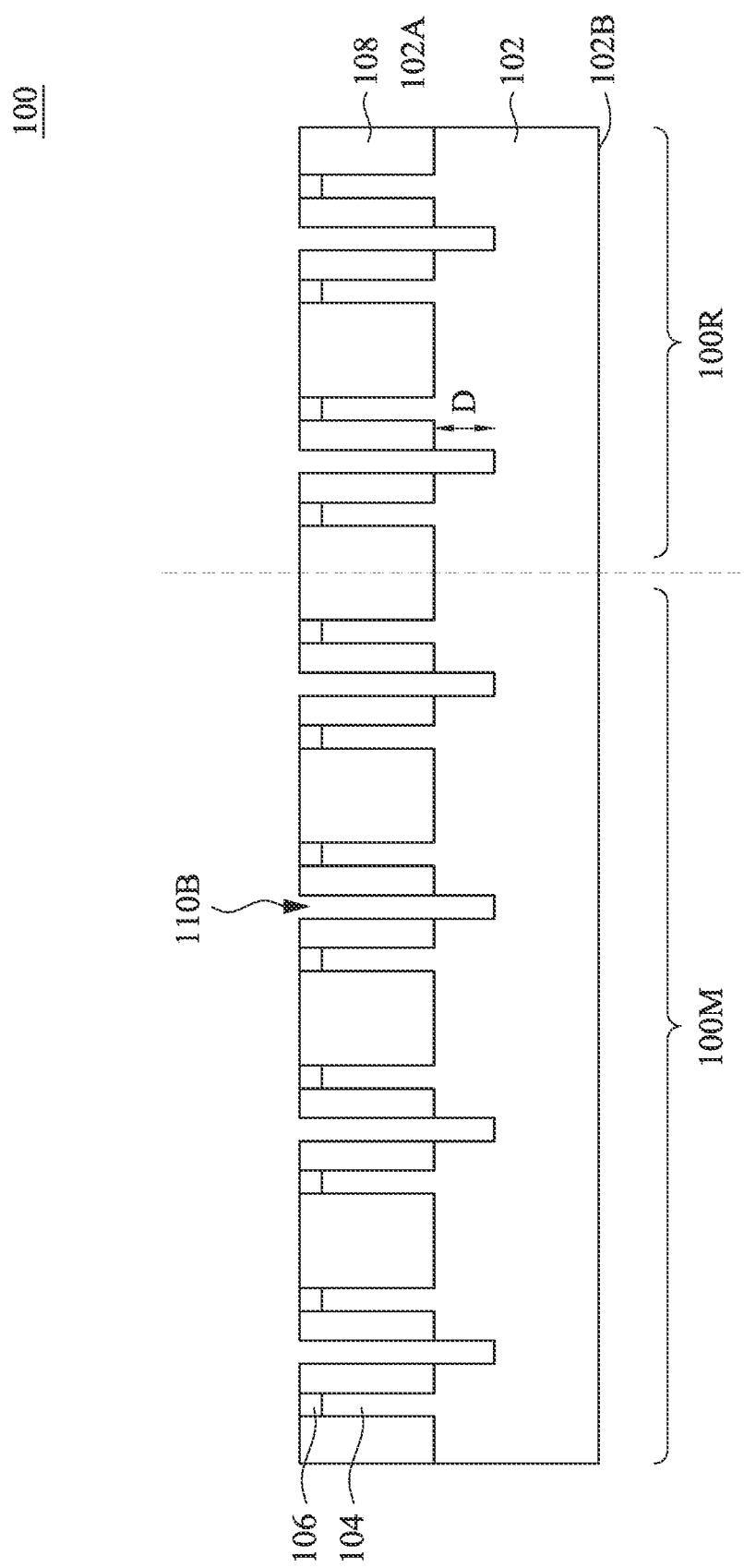
Figure 5A:
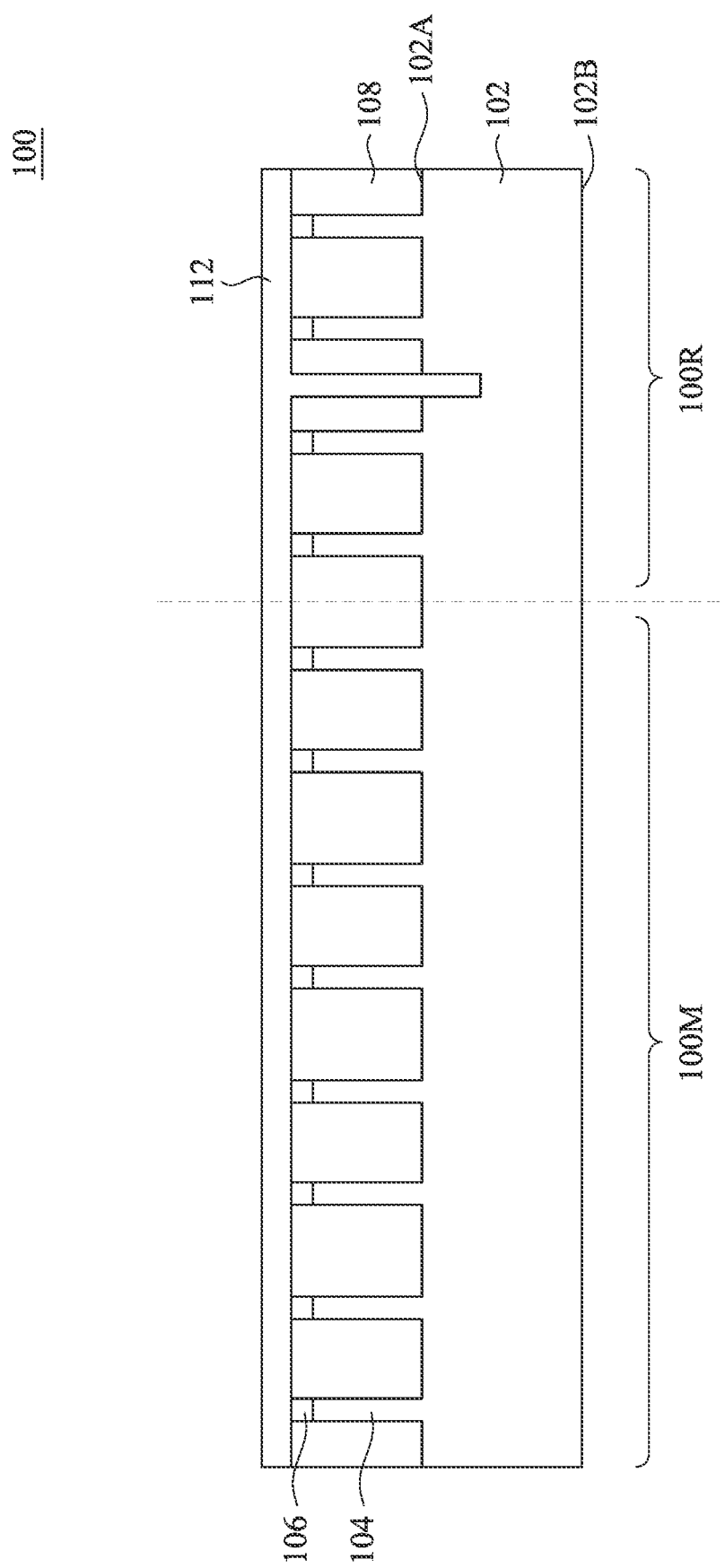
Figure 5B:
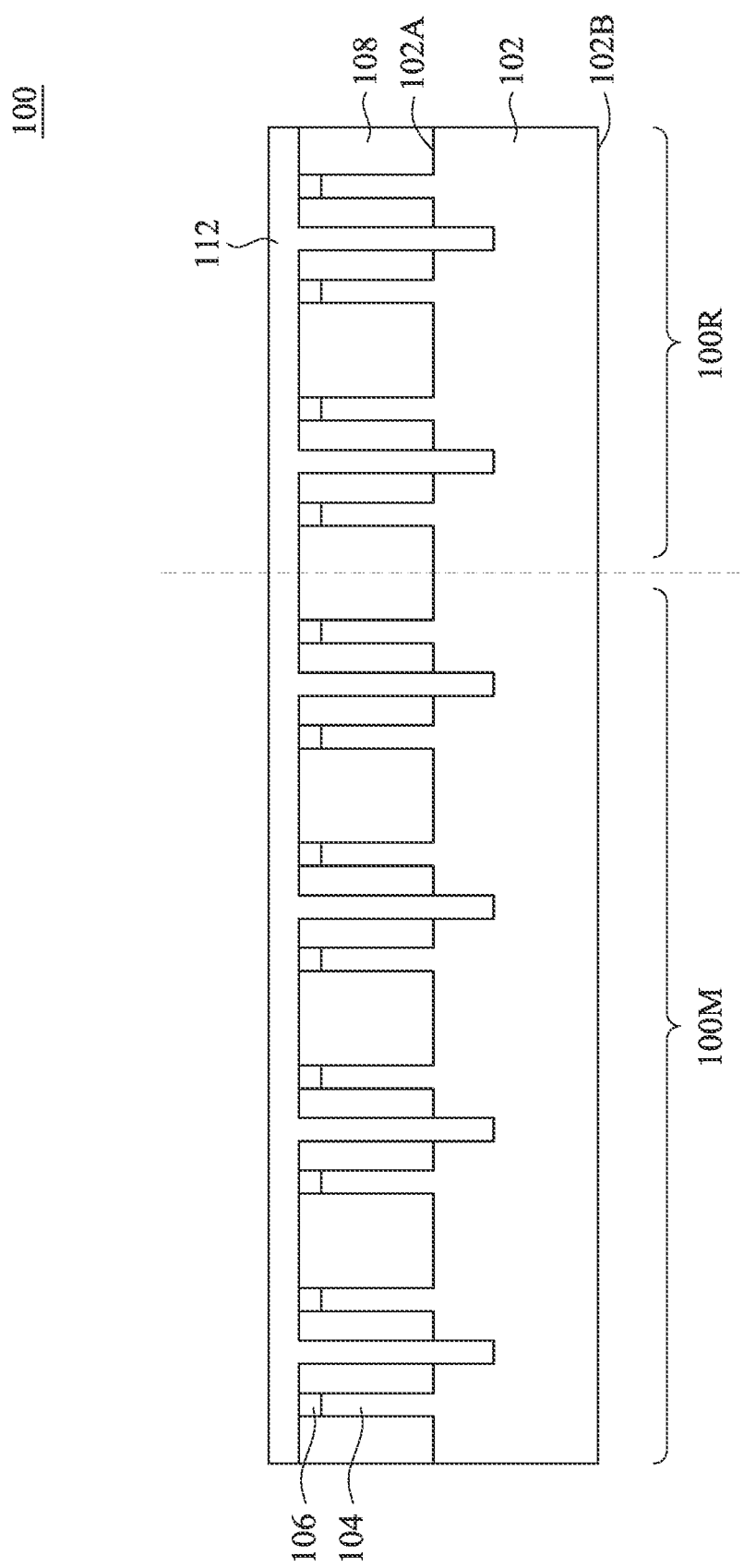
Figure 6A:
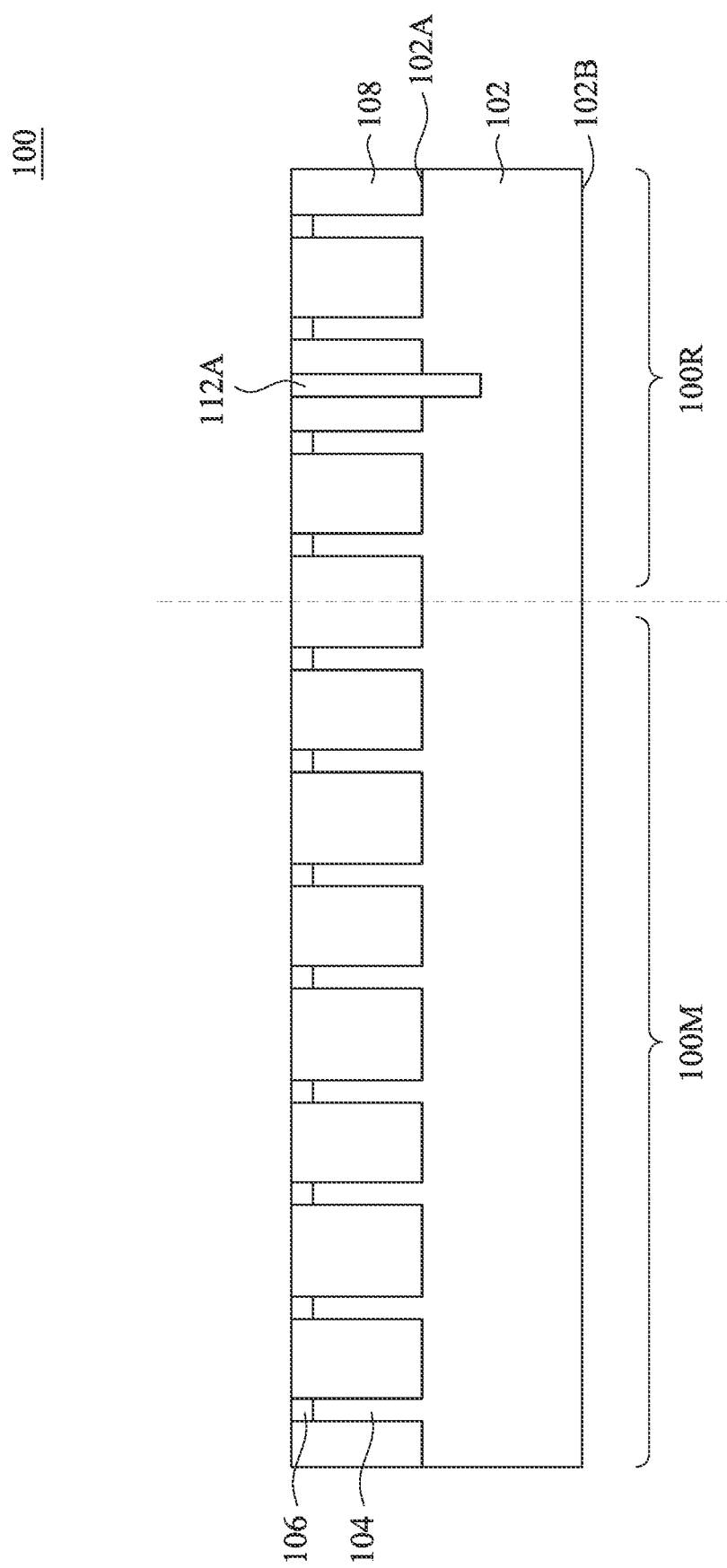
Figure 6B:
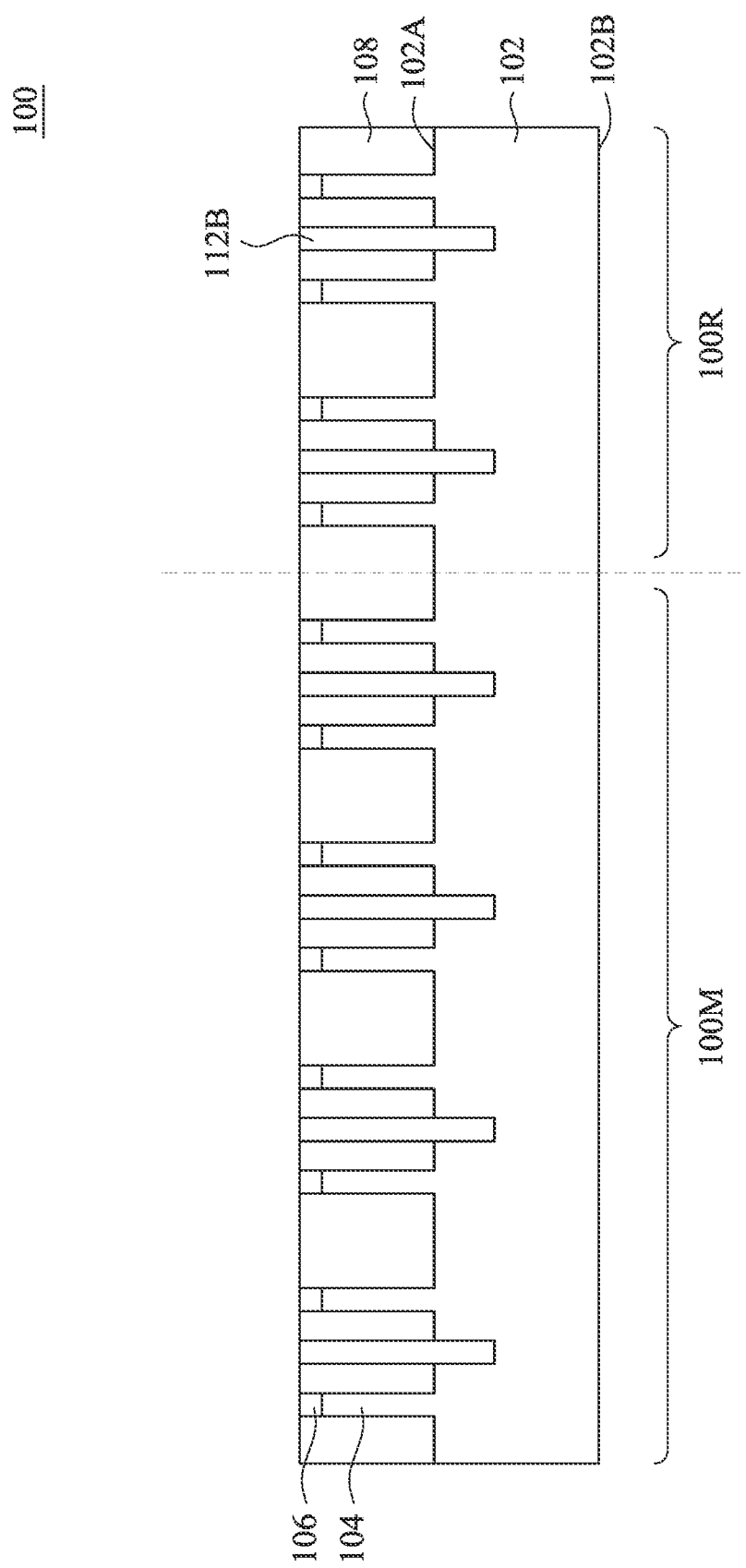

In FIGS. 4A and 4B, buried contact holes 110A and buried contact holes 110B are formed in the insulating layer 108 and adjacent to the protrusions 104 in accordance with some embodiments. In FIGS. 5A and 5B, the buried contact holes 110A and 110B are filled with a conductive material in accordance with some embodiments. In FIGS. 6A and 6B, a planarizing process such as CMP is performed to remove excessive portions of the conductive material to form buried contacts 112A and buried contacts 112B in accordance with some embodiments. For example, a portion of the conductive material over the insulating layer 108 and the mask layer 106 is removed.

In some embodiments, the buried contact holes 110A and 110B have a round shape, a square, or a rounded square in a plan view. In other embodiments, the buried contact holes 110A and 110B have a shape, such as an ellipse, a rectangle, or a rounded rectangle, that has a long axis substantially parallel with the protrusions 104 (e.g., substantially parallel with the X-direction illustrated in FIG. 12C) in a plan view. In some embodiments, the buried contact holes 110A and 110B have a bottom that is lower than the bottom of the protrusions 104 and the top surface 102A of the substrate 102. For example, the buried contact holes 110A and 110B may have a depth D of about 10 nm to about 50 nm deeper than the bottom of the protrusions 104 or the top surface 102A of the substrate 102. The buried contact holes 110A and the buried contact holes 110B may have a diameter of about 10 nm to about 40 nm. In some embodiments, the buried contact holes 110A or the buried contact holes 110B have an aspect ratio of about 1:10 to about 1:100. The buried contact holes 110A and the buried contact holes 110B may be formed in the same lithography and etching processes. Alternatively, the buried contact holes 110A and the buried contact holes 110B are formed in the same etching process but with separate lithography processes.

The buried contacts 112A are formed underlying the subsequently formed gate electrode 132 (e.g., referring to FIG. 13A) in the routing regions 100R in accordance with some embodiments. The buried contacts 112A may also be formed in any regions of the semiconductor device 100, including, for example but not limited, the cell region 100M, the logic region, other routing regions, or combinations thereof. The buried contacts 112B are formed underlying the subsequently formed source features 130S of transistors 130 (e.g., referring to FIG. 12B) in the cell region loots and the routing region 100R in accordance with some embodiments. The buried contacts 112B may also be formed in any regions of the semiconductor device 100, including, for example but not limited, the logic regions, other routing regions, or combinations thereof. In some embodiments, as illustrated in FIG. 12C, the buried contacts 112A and the buried contacts 112B are staggered from each other in the Y-direction.

In some embodiments, the conductive material of the buried contacts 112A and 112B includes a conductive layer over a barrier layer. The conductive layer of the buried contacts 112A and 112B may include tungsten, cobalt, ruthenium, rhodium, alloys thereof, or a combination thereof. The barrier layer may be a layer formed along the buried contact holes 110A and 110B. The barrier layer of the buried contacts 112A and 112B may include titanium, titanium nitride, tantalum, tantalum nitride, tungsten nitride, ruthenium, rhodium, platinum, other noble metals, other refractory metals, their nitrides, combinations of these, or the like. In other embodiments, the barrier layer may be not employed with the buried contacts, however. The conductive material may be deposited by sputtering, physical vapor deposition (PVD), CVD, or atomic layer deposition (ALD).

Figure 7A:
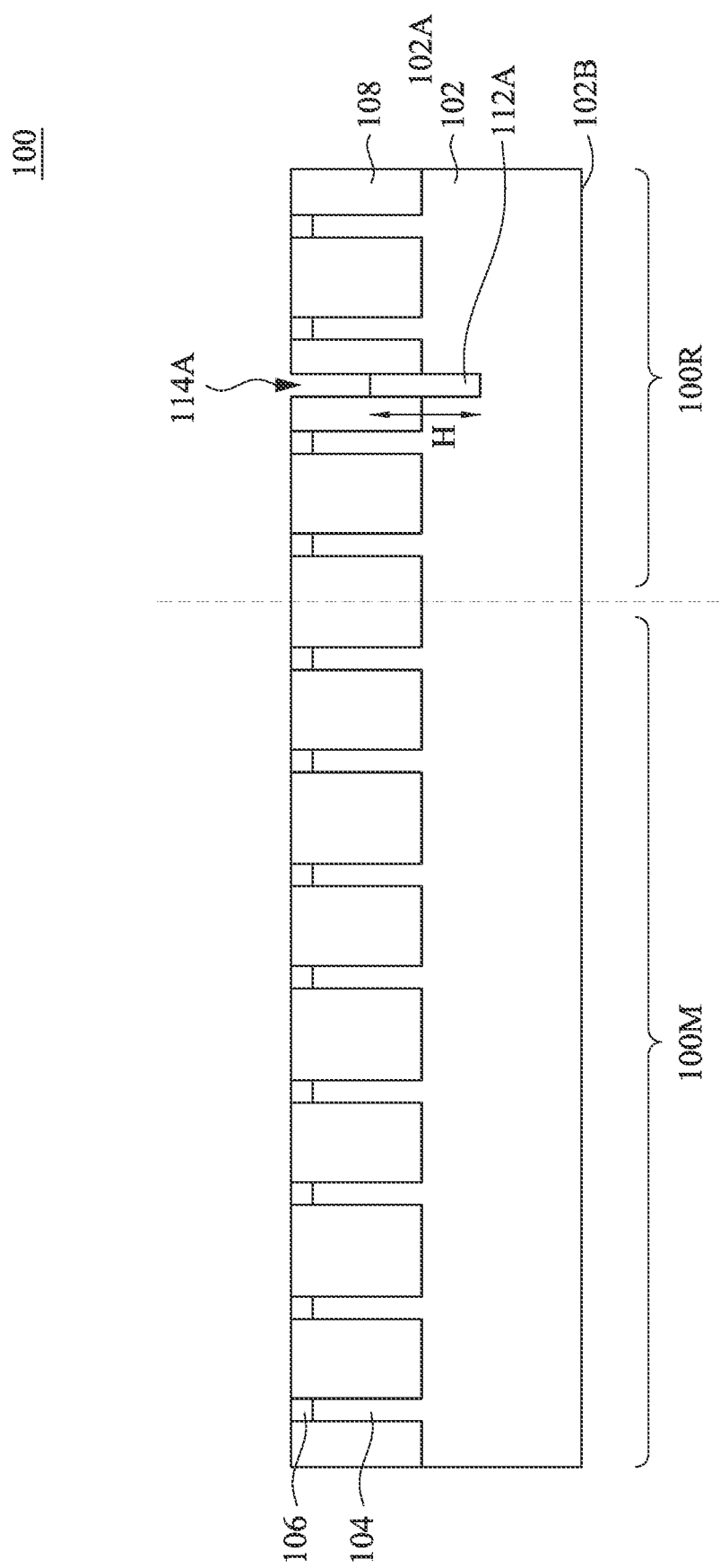
Figure 7B:
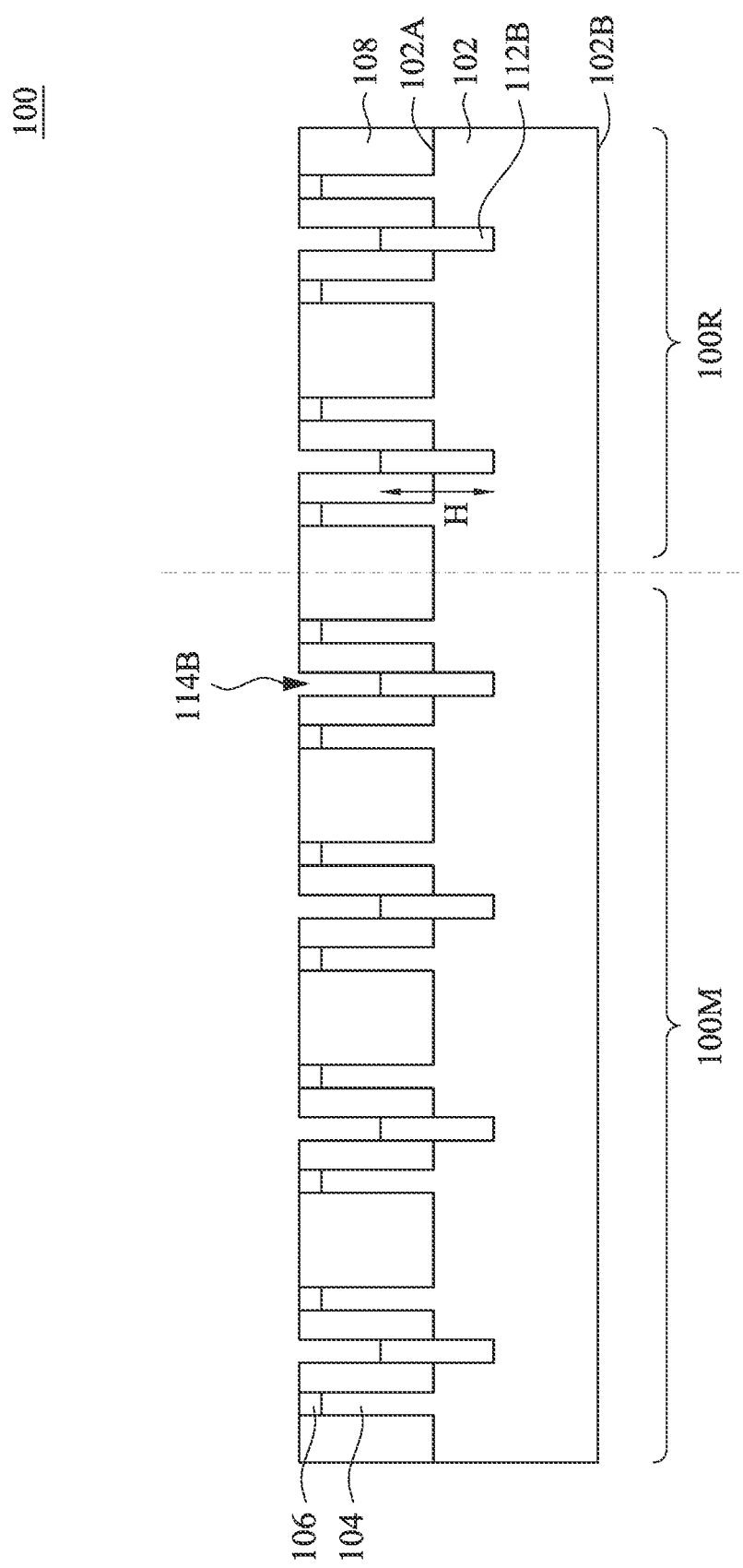

Turning to FIGS. 7A and 7B, the buried contacts 112A and 112B are etched back (e.g., etched from top) by an etching process in accordance with some embodiments. Cavities 114A and 114B are formed over and expose the buried contacts 112A and 112B, respectively. The etching process may be a dry etching process such as reactive ion etching or ion beam etching, a wet etching process, or other suitable etching processes. For example, the buried contact may be etched by a fluorine-based material, such as $SF_6$. The etching back process leaves a height H of the buried contacts 112A and 112B in the buried contact holes 110A and 110B. In some embodiments, the height H is about 30 nm to about 100 nm.

Figure 8A:
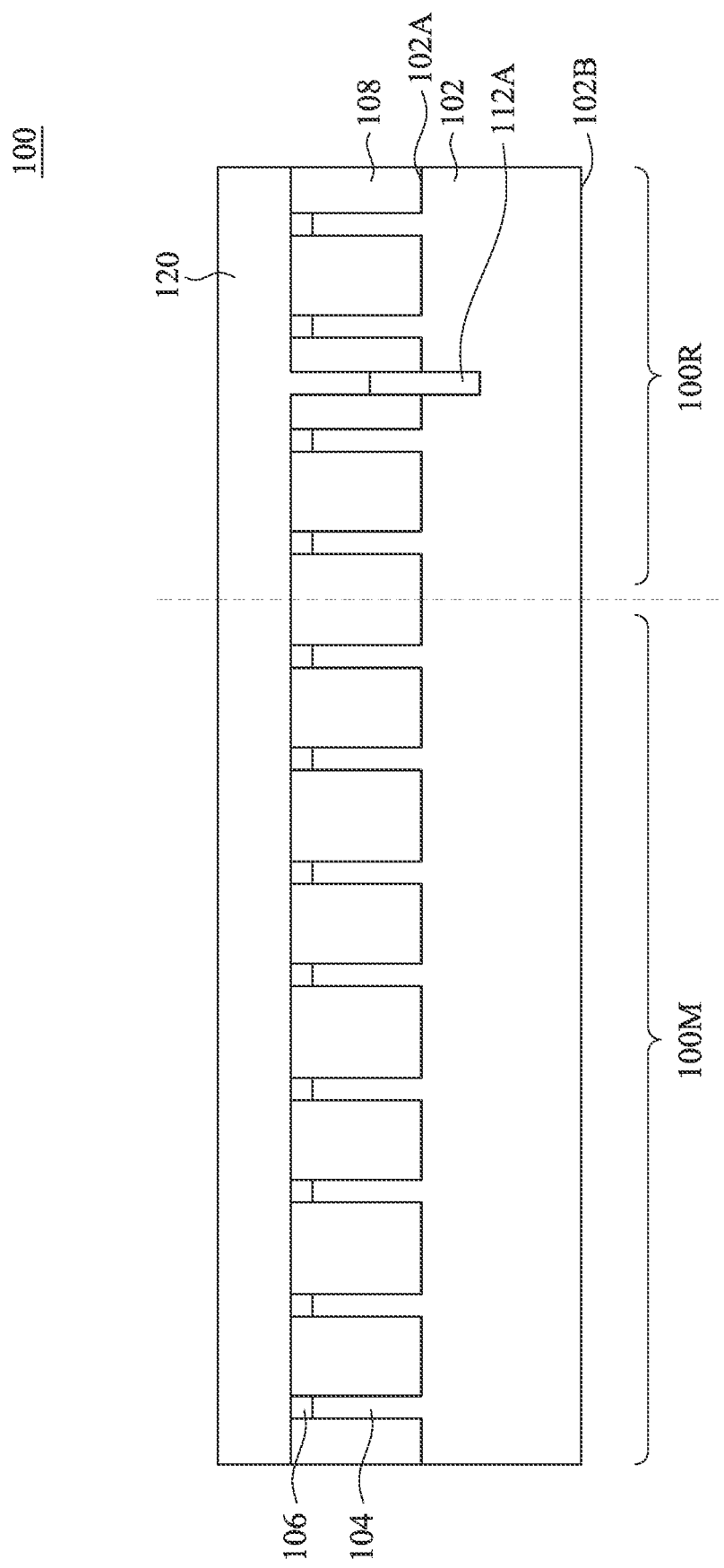
Figure 8B:

Turning to FIGS. 8A and 8B, a protection layer 120 is formed over the insulating layer 108 and fills the cavities 114A and 114B in accordance with some embodiments. The protection layer 120 may include silicon oxide, silicon oxynitride, a spin-on dielectric material, a photoresist, or a low-k dielectric such porous silicon oxide or other suitable dielectric materials having a dielectric constant lower than 3.9. The protection layer 120 may be formed by CVD, HDP-CVD, SACVD, FCVD, or by spin on. In some embodiments, the protection layer 120 includes the same material as the isolation features of the insulating layer 108.

Figure 9A:
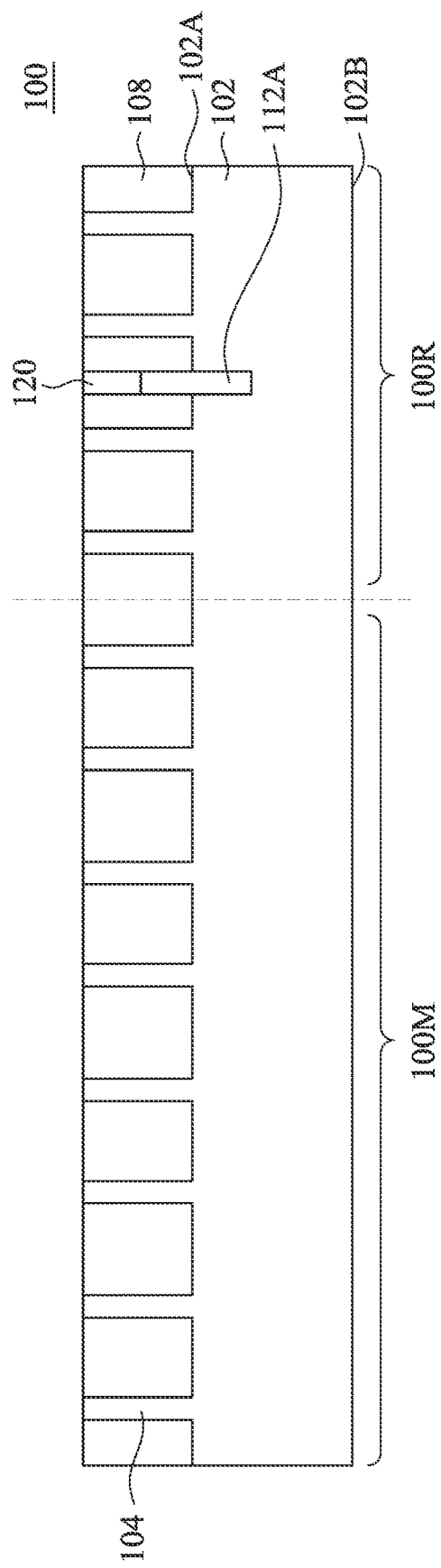
Figure 9B:
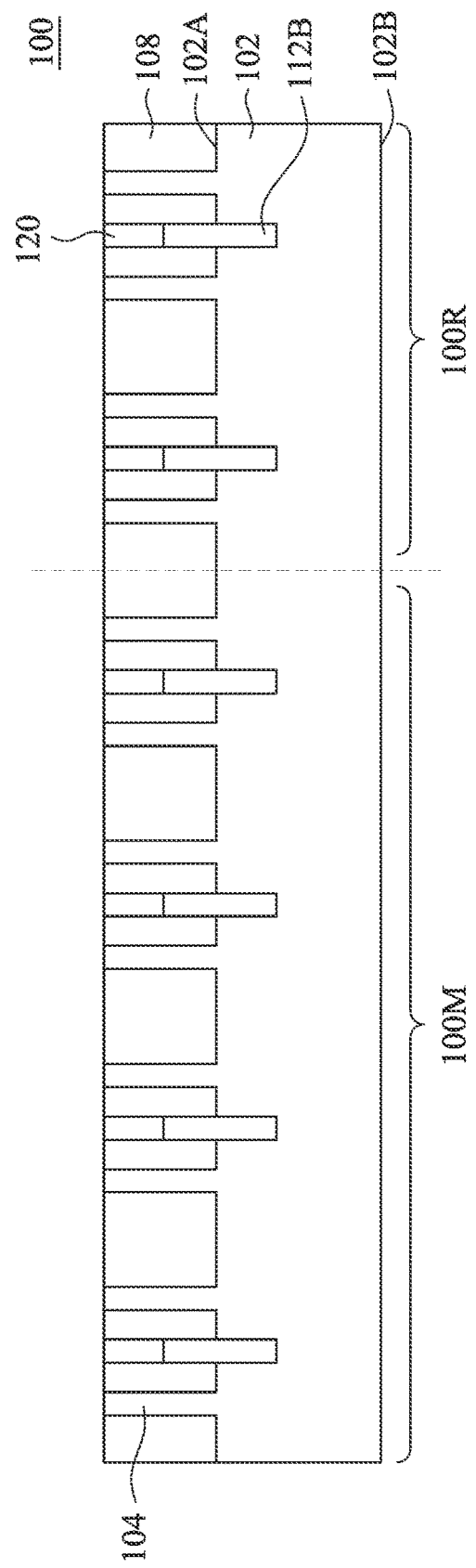

Turning to FIGS. 9A and 9B, a polishing process such as CMP is performed in accordance with some embodiments. In an embodiment, the mask layer 106, a portion of the insulating layer 108, and a portion of the protection layer 120 are removed by the polishing process. In some embodiments, upper portions of protrusions 104 are also removed by the polishing process.

Figure 10A:
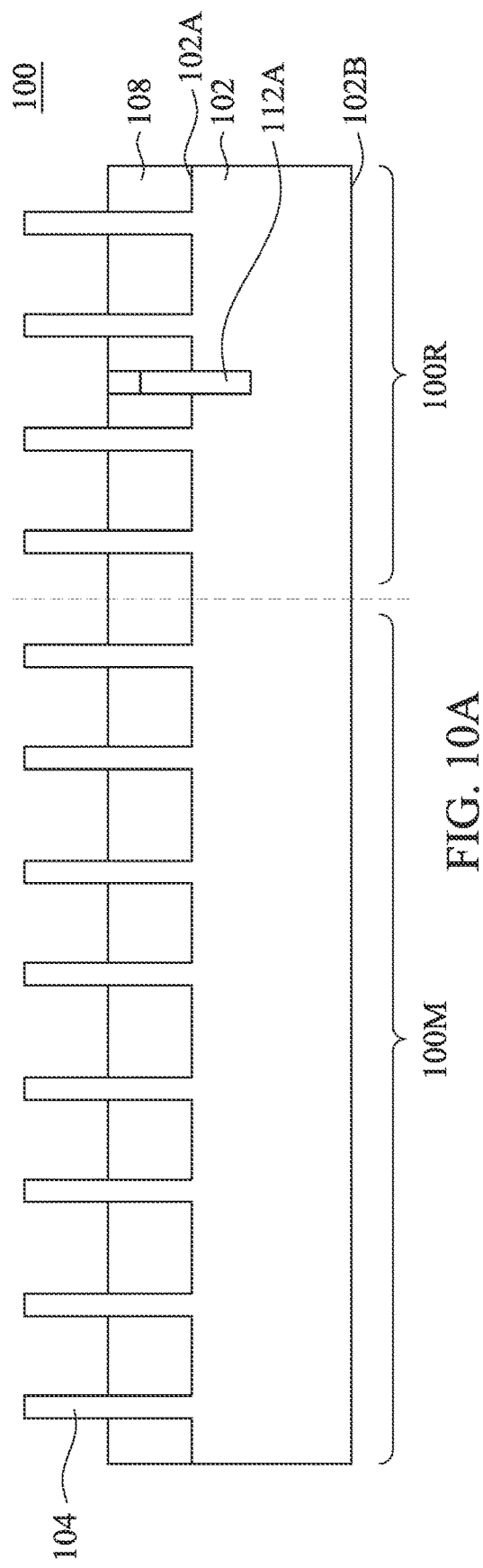
Figure 10B:
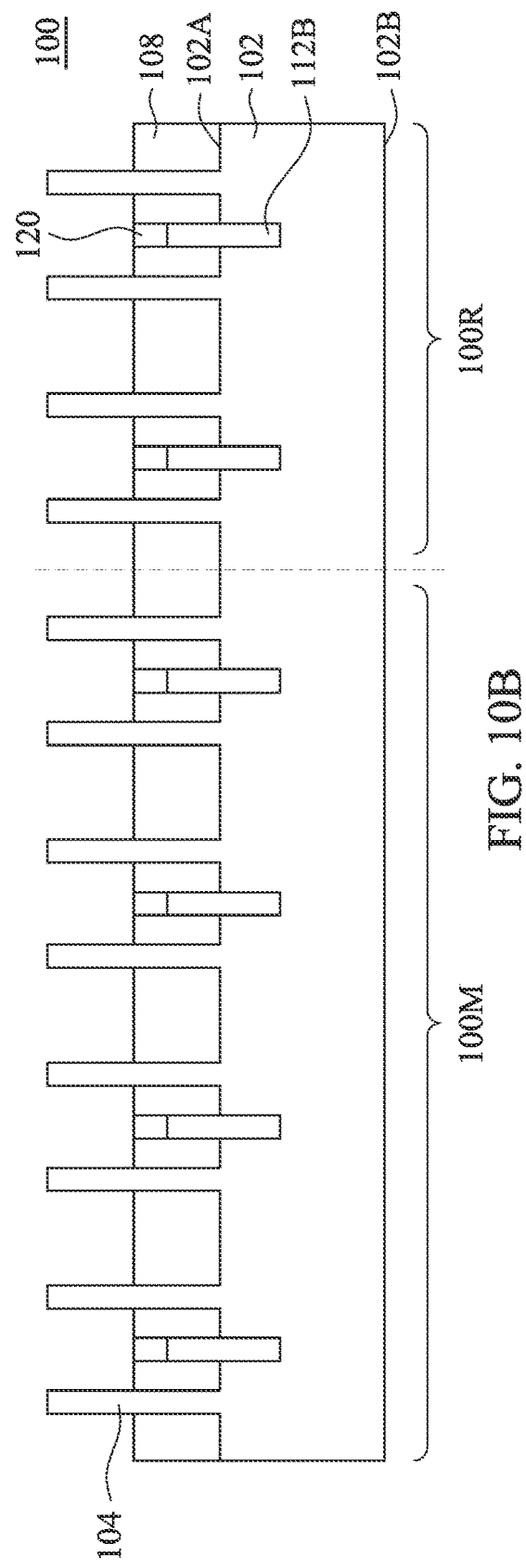

Turning to FIGS. 10A and 10B, the insulating layer 108 and the protection layer 120 are etched back (e.g., etched from the top) by an etching process in accordance with some embodiments. A portion of the insulating layer 108 and a portion of the protection layer 120 may be removed, and the protrusions 104 may protrude over the top surface of insulating layer 108. In some embodiments, the insulating layer 108 and the protection layer 120 are etched in the same etching process. In other embodiments, the insulating layer 108 and the protection layer 120 are etched in different etching processes. For example, one of the insulating layer 108 and the protection layer 120 may be etched while the other layer is covered by a patterned photoresist layer, and the other layer is then etched, with or without applying another photoresist layer, after the patterned photoresist layer is removed. In some embodiments, the protection layer 120 has a top surface higher than or substantially level with the top surface of the insulating layer 108.

Figure 11A:
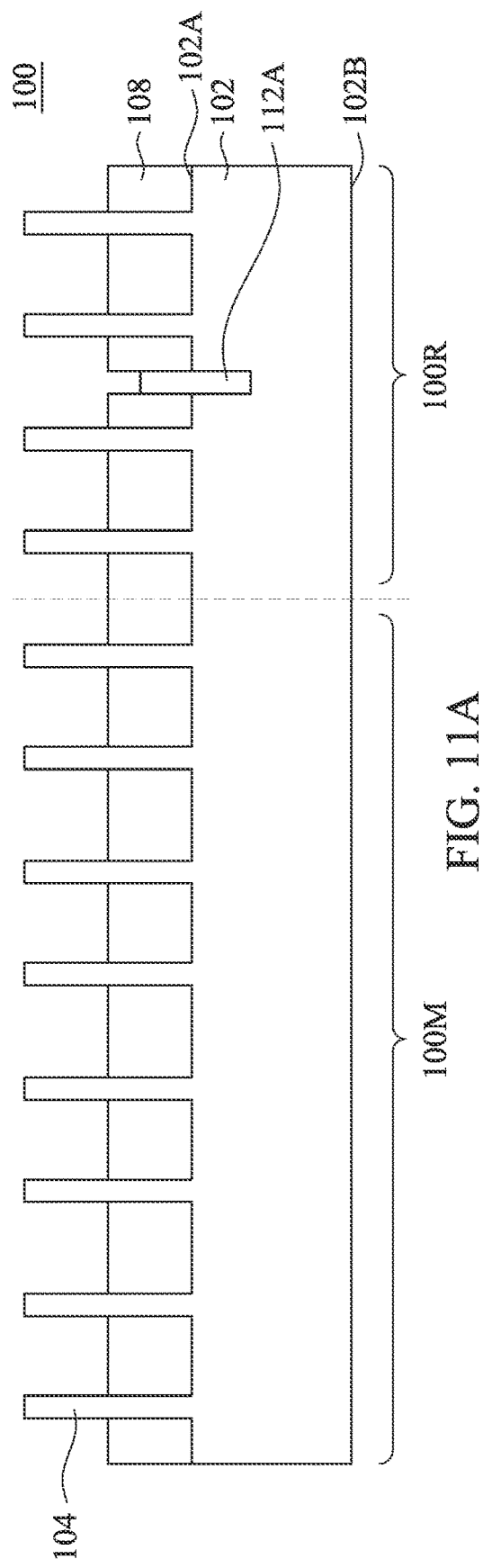
Figure 11B:
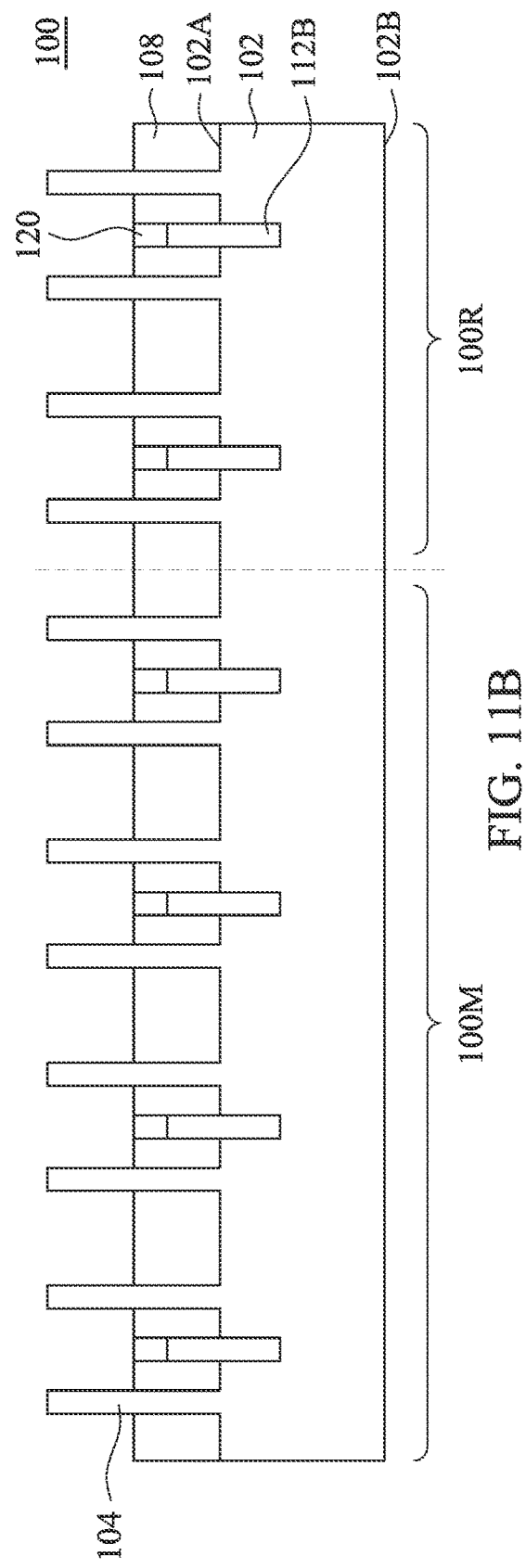

In FIGS. 11A and 11B, a portion of the protection layer 120 over the buried contacts 112A is removed by an etching process in accordance with some embodiments. Accordingly, the buried contacts 112A are exposed while the buried contacts 112B are still covered by the protection layer 120. In some embodiments, the etching process illustrated in FIG. 10A may also include removing the portion of the protection layer 120 over the buried contacts 112A, and a separate etching process to expose the buried contacts 112A is thus omitted.

Turning to FIG. 12A, dummy gate strips 132 are formed over the exposed buried contacts 112A. As illustrated in FIG. 12C, the dummy gate strips 132 extend along with the Y-direction and across the protrusions 104. Although FIG. 12A only shows the dummy gate strips 132 partially wrap over the protrusion 104, the dummy gate strips 132 may fully wrap around the protrusions 104 when the protrusions 104 are made of a stack of nanowires, in accordance with some embodiments. The dummy gate strips 132 may include polysilicon. The dummy gate strips 132 may be formed by a method that includes: depositing a dummy gate layer covering the protrusions 104, the exposed buried contacts 112A, and the insulating layer 108; forming a photoresist layer that has strip patterns over the dummy gate layer; and etching the dummy gate layer according to the patterns of the photoresist layer. The photoresist layer may be removed during or after the etching process of etching the polysilicon layer. In some embodiments, gate spacers (not shown in Figures) are formed on exposed surfaces of the dummy gate strips 132. Any suitable methods of forming gate spacers may be used. In some embodiments, a deposition such as ALD, CVD, or the like may be used to form the gate spacers. In some embodiments, the gate spacers have a thickness of about 1 nm to about 5 nm. The gate spacers may include any suitable material. For example, the gate spacers may include a dielectric material such as silicon oxide, silicon nitride, silicon carbide, silicon oxynitride, or a combination thereof.

Turning to FIG. 12B and FIG. 12C, source features 130S and drain features 130D of transistors 130 are formed over the protrusions 104, beside the dummy gate strips 132, in accordance with some embodiments. The source features 130S and the drain features 130D are separated by the dummy gate strips 132 (and hence, only source features 130S are visible in the cross-sectional plane illustrated in FIG. 12B). In some embodiments, the protrusions 104, beside the portion under the dummy gate strips 132, are recessed to form recesses, and then the source/drain features 130S and 130D are formed over in the recesses by epitaxial growing processes, including CVD deposition techniques (e.g., vapor-phase epitaxy (VPE) and/or ultra-high vacuum CVD (UHV-CVD)), molecular beam epitaxy, and/or other suitable processes. The source/drain features 130S and 130D may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the recesses are filled with the source/drain feature 130S and 130D, further epitaxial growth of a top layer of the source/drain features 130S and 130D expands horizontally and facets may start to form, such as diamond shape facets. The source/drain features 130S and 130D may be in-situ doped during the epi processes. In some embodiments, the source/drain features 130S and 130D is not in-situ doped, and an implantation process is performed to dope the source/drain features 130S and 130D. One or more annealing processes may be performed to activate dopants. The annealing processes comprise rapid thermal annealing (RTA) and/or laser annealing processes. Each of the source/drain features 130S and 130D may have an impurity concentration from about $10^{19}$ cm$^{-3}$ to about $10^{21}$ cm$^{-3}$.

In some embodiments, an etching stop layer (not shown in Figures) is conformally formed over the source/drain features 130S and 130D. The etching stop layer may be formed of a dielectric material that has a different film property than the source/drain features 130S and 130D, to improve the etching selectivity when an etching process is performed in the subsequent manufacturing stages. In some embodiments, the etching stop layer includes silicon nitride, silicon carbide, silicon oxynitride, or combinations thereof.

An insulating layer 140 is disposed between each of the dummy gate strips 132 and over the source/drain features 130S and 130D. The insulating layer 140 may include silicon oxide, silicon oxynitride, a spin-on dielectric material, or a low-k dielectric such as porous silicon oxide or other suitable dielectric materials having a dielectric constant lower than 3.9. The insulating layer may be formed by FCVD, HDP-CVD, SACVD, or by spin on. The insulating layer 140 may include a single layer or multiple layers. The insulating layer 140 may have the same material as the isolation features of the insulating layer 108. In some embodiments, the insulating layer 140 has a top surface substantially level with the top surface of the dummy gate strips 132 by polishing back. In other embodiments, the insulating layer 140 covers the top of the dummy gate strips 132.

Figure 13A:
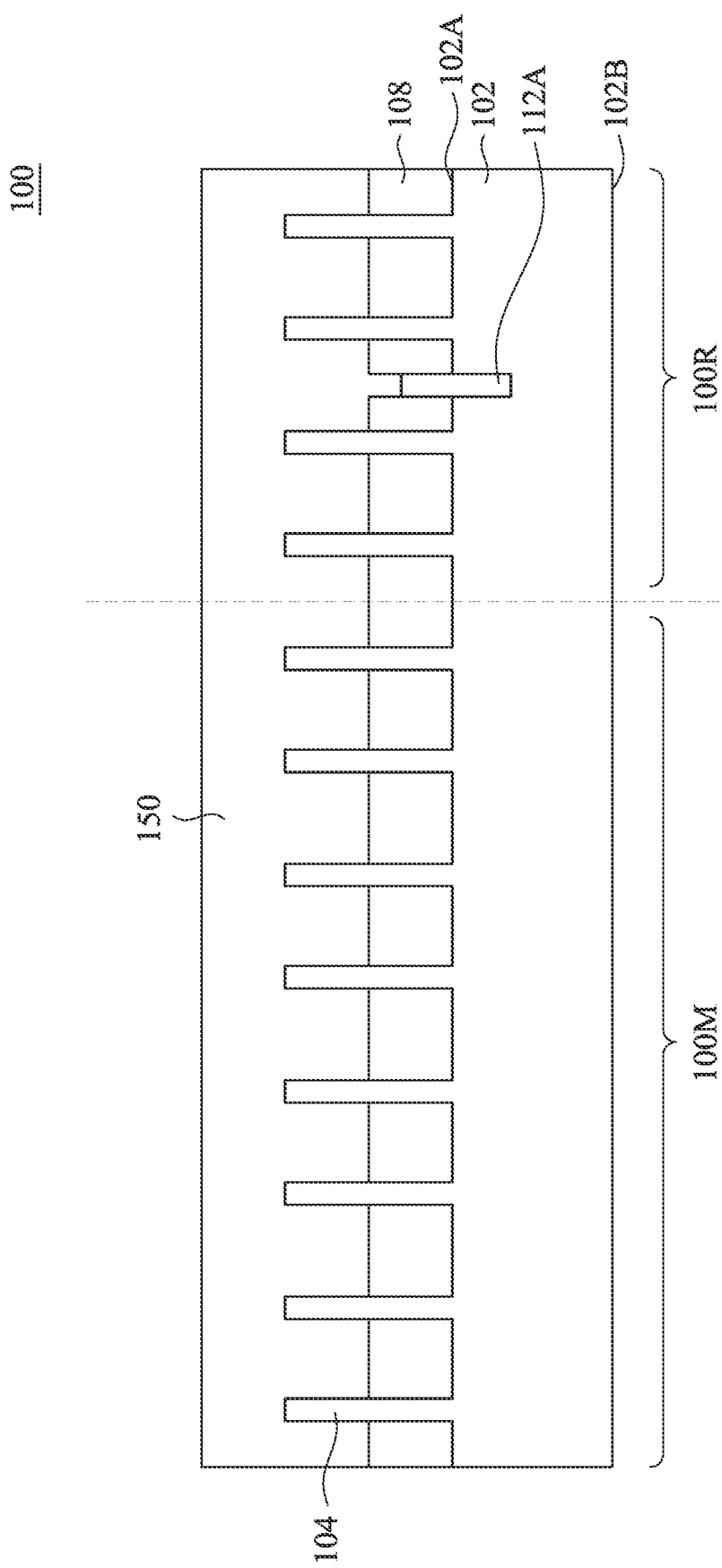
Figure 13B:
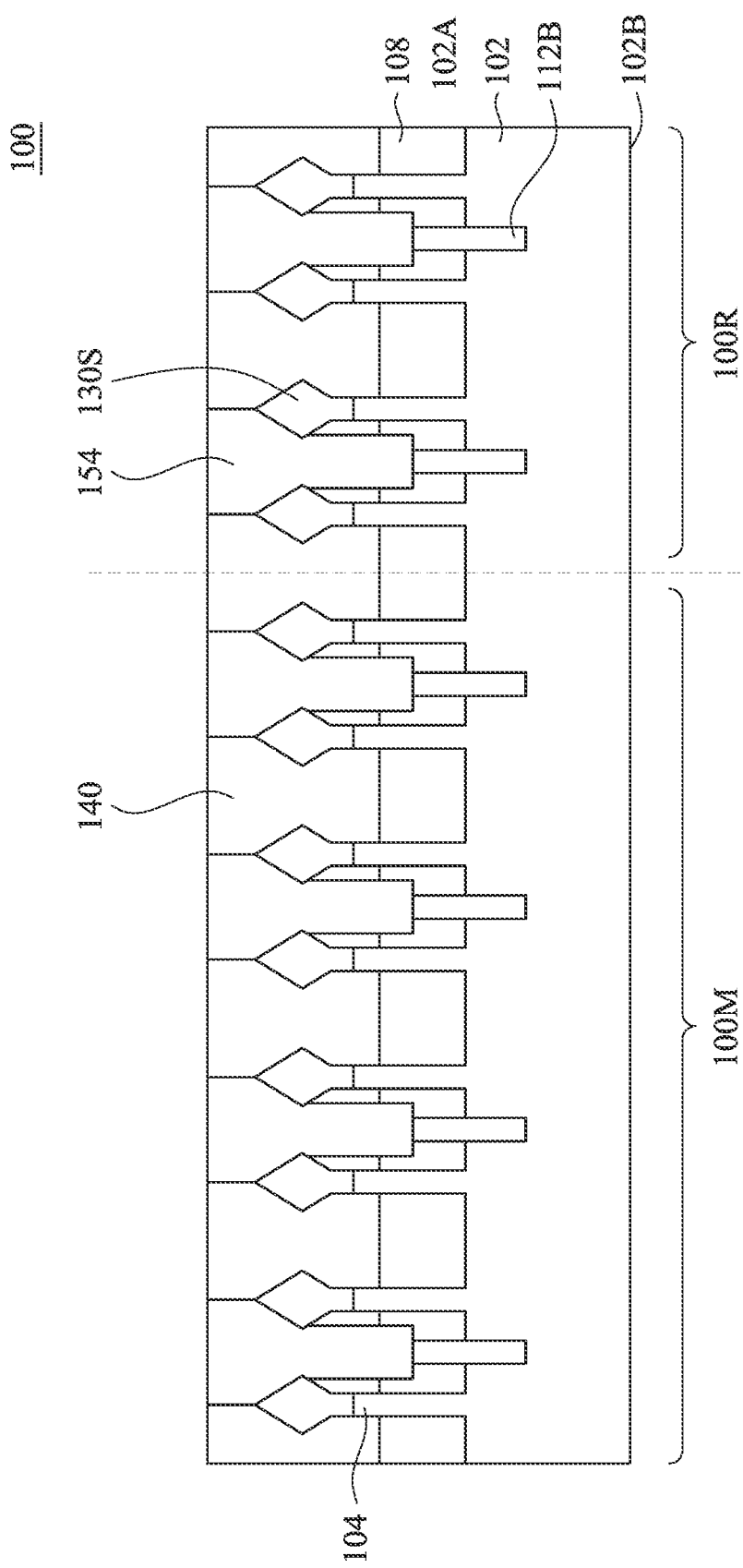

Turning to FIGS. 13A and 13B, a gate structure 150 is formed over the first side 102A of the substrate 102 by replacing the dummy gate strips 132 in accordance with some embodiments. The gate structure 150 includes a work function metal layer formed over a gate dielectric layer (or alternatively, multiple work function metal layers). A metal gate electrode is disposed on the work function metal layer. However, numerous other layers, such as an interface layer, liner layer, barrier layer, or other suitable layers, may be included in the gate structure as needed. The gate dielectric layer of the gate structure 150 may include silicon oxide. The silicon oxide may be formed by suitable oxidation and/or deposition methods. Alternatively, the gate dielectric layer of the gate structure 150 may include a high-k dielectric layer such as hafnium oxide (HfO$_2$), TiO$_2$, HfZrO, Ta$_2$O$_3$, HfSiO$_4$, ZrO$_2$, ZrSiO$_2$, combinations thereof, or other suitable material. The high-k dielectric layer may be formed by ALD and/or other suitable methods.

The work function metal layer is formed for tuning the work function of the later formed metal gate structures in an NMOS or a PMOS. Thus, the work function metal layer may be p-type work function metal materials for PMOS devices or n-type work function metal materials for NMOS devices. Suitable examples of the p-type work function metals, which may have a work function ranging between 4.8 eV and 5.2 eV, include TiN, TaN, Ru, Mo, Al, WN, ZrSi$_2$, MoSi$_2$, TaSi$_2$, NiSi$_2$, WN, other suitable p-type work function metal materials, and combinations thereof. Suitable examples of the n-type work function metal materials, which may have a work function ranging between 3.9 eV and 4.3 eV, include Ti, Ag, TaAl, TaAlC, HfAl, TiAl, TiAlN, TaC, TaCN, TaSiN, Mn, Zr, other suitable n-type work function metal materials, or combinations thereof.

A work function value is associated with the material composition of the work function metal layer. The material of the work function metal layer is chosen to tune a work function value so that the desired threshold voltage (Vt) is achieved in the device that is to be formed in the respective region. The work function metal layer can provide uniform threshold voltage (Vt) and drain voltage. The work function metal layer may be deposited by CVD, PVD, ALD, and/or other suitable processes. In one example depicted herein, the work function metal layer is formed using an ALD process.

In FIG. 13B, source contact plugs 154 are formed over the source features 130S. In some embodiments, each of the source contact plugs 154 connects at least two or more adjacent source features 130S to one of the buried contacts 112B, as illustrated in FIG. 13B. In other embodiments, each of the source contact plugs 154 connects one source feature 130S to one of the buried contacts 112B. The source contact plugs 154 may be formed by suitable lithography, etching, and deposition processes. For example, a photoresist layer may be deposited over the insulating layer 140. The photoresist layer is patterned to have openings aligning the buried contacts 112B and their adjacent source features 130S by a lithography process. The insulating layer 140, the etch stop layer, and the protection layer 120 over the buried contacts 112B are etched according to the openings of the photoresist layer to form openings that expose the buried contacts 112B and the source features 130S. The openings are filled with a conductive material with a suitable deposition process. A planarizing process such as a CMP process is then performed to remove excess conductive material over the insulating layer 140. In some embodiments, before the photoresist layer is deposited, one or more dielectric layers (not shown in Figures) is formed over the insulating layer 140 and then etched together with the insulating layer 140 and remain in the final structure of the semiconductor device 100.

In some embodiments, the source contact plugs 154 include a conductive layer over a barrier layer. The barrier layer of the source contact plugs 154 may be formed of one or more layers of titanium, titanium nitride, tantalum, tantalum nitride, tungsten nitride, ruthenium, rhodium, platinum, other noble metals, other refractory metals, their nitrides, combinations of these, or the like. The conductive layer of the source contact plugs 154 may be a metal material such as tungsten, cobalt, ruthenium, rhodium, alloys thereof, the like, or combinations thereof. The barrier layer or the conductive layer of the source contact plugs 154 may be formed using a suitable process such as CVD, PVD, ALD, plating, or the like.

Figure 14A:
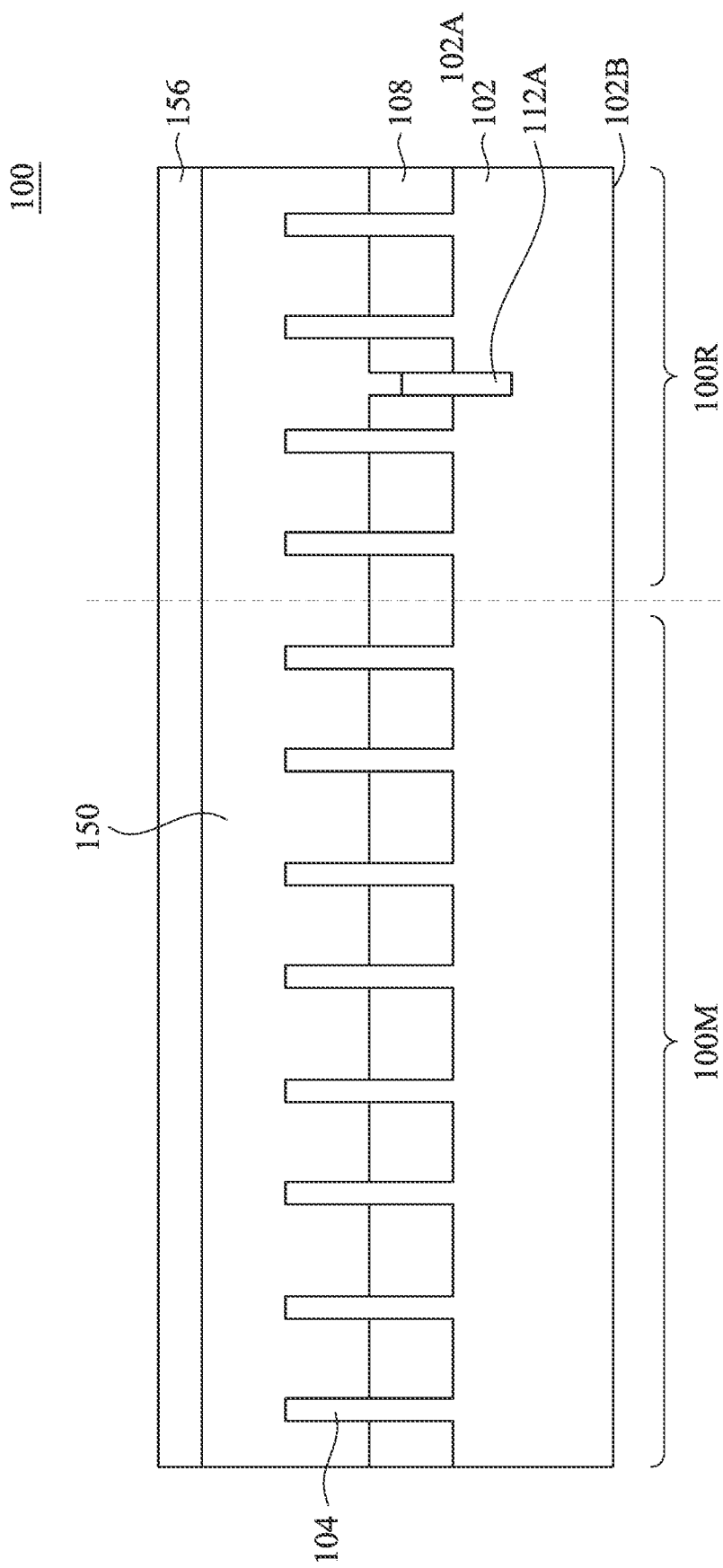
Figure 14B:
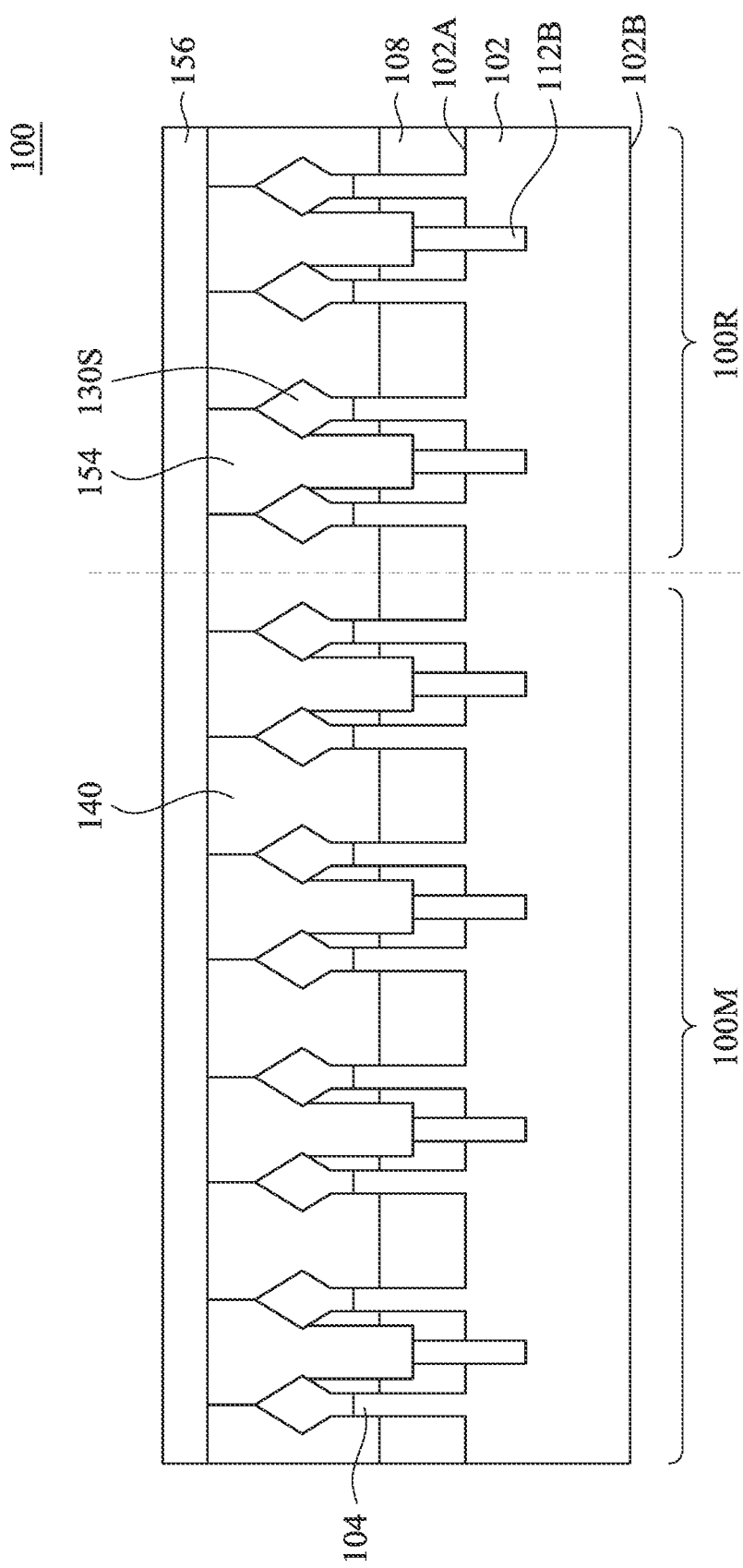
Figure 14C:
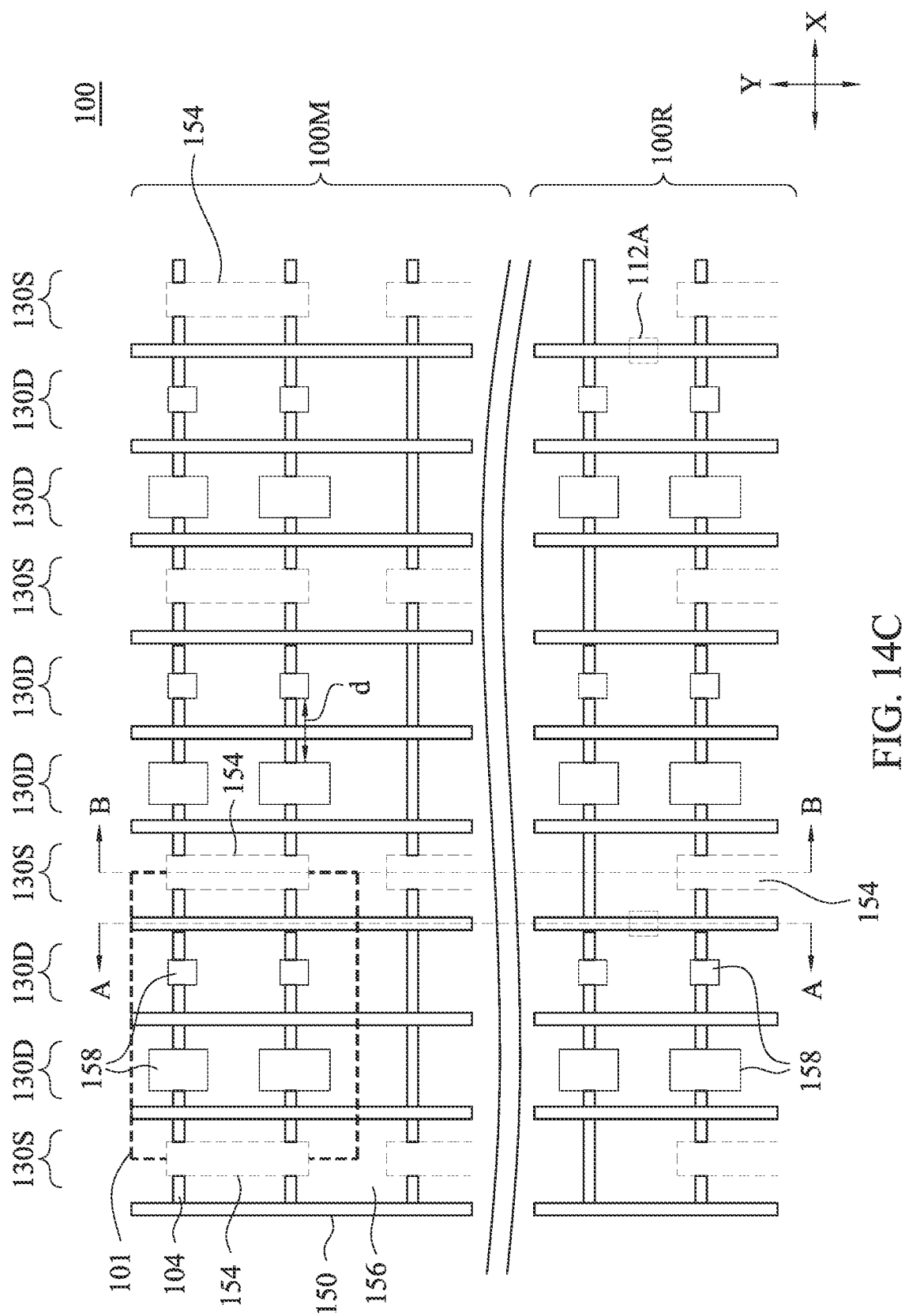

Turning to FIGS. 14A, 14B, and 14C, a dielectric layer 156 is deposited over the gate structure 150, the insulating layer 140, and the source contact plugs 154. In some embodiments, the dielectric layer 156 may include silicon oxide, silicon oxynitride, silicon nitride, silicon oxycarbide, polymer, a low-k dielectric, or a combination thereof. The dielectric layer 156 may be formed by FCVD, HDP-CVD, SACVD, or by spin on. In some embodiments, the dielectric layer 156 is omitted.

Drain contact plugs 158 are then formed over the drain features 130D of the transistors 130 in accordance with some embodiments. The drain contact plugs 158 may be formed by suitable lithography, etching, and deposition processes. For example, a photoresist layer may be blanket deposited over the dielectric layer 156. The photoresist layer is patterned to have openings aligning to the drain features 130D by a lithography process. The dielectric layer 156, the insulating layer 140, and the etched stop layer are etched according to the openings of the photoresist layer to form openings that expose the drain features 130D. The openings are filled with a conductive material with a suitable deposition process. A planarizing process such as the CMP process is then performed to remove the excess conductive material over the dielectric layer 156.

In some embodiments, the drain contact plugs 158 include a conductive layer over a barrier layer. The barrier layer of the drain contact plugs 158 may be formed of one or more layers of titanium, titanium nitride, tantalum, tantalum nitride, tungsten nitride, ruthenium, rhodium, platinum, other noble metals, other refractory metals, their nitrides, combinations of these, or the like. The conductive material of the drain contact plugs 158 may be a metal material such as tungsten, cobalt, ruthenium, rhodium, alloys thereof, the like, or combinations thereof. The barrier layer or the conductive material of the drain contact plugs 158 may be formed using a suitable process such as CVD, PVD, ALD, plating, or the like.

As illustrated in FIG. 14C, the drain contact plugs 158 may have at least two different shapes. For example, in an embodiment, one column of a pair of adjacent drain contact plugs 158 has a relatively longer length in the Y-direction (i.e., along with the direction of columns) as illustrated in FIG. 14C and has a rectangular-like or ellipse-like shape in a plan view. The other column of the pair of adjacent drain contact plugs 158 has a relatively shorter length in the Y-direction as illustrated in FIG. 14C and has a square-like or a circular-like shape in a plan view. In one embodiment, each of the drain contact plugs 158 connects to one drain feature 130D as illustrated in FIG. 14C. In other embodiments, each of the drain contact plugs 158 may connect to two or more drain features 130D. In some embodiments, two adjacent drain contact plugs 158 have a distance of about 30 nm to about 150 nm in the X-direction.

Figure 16:
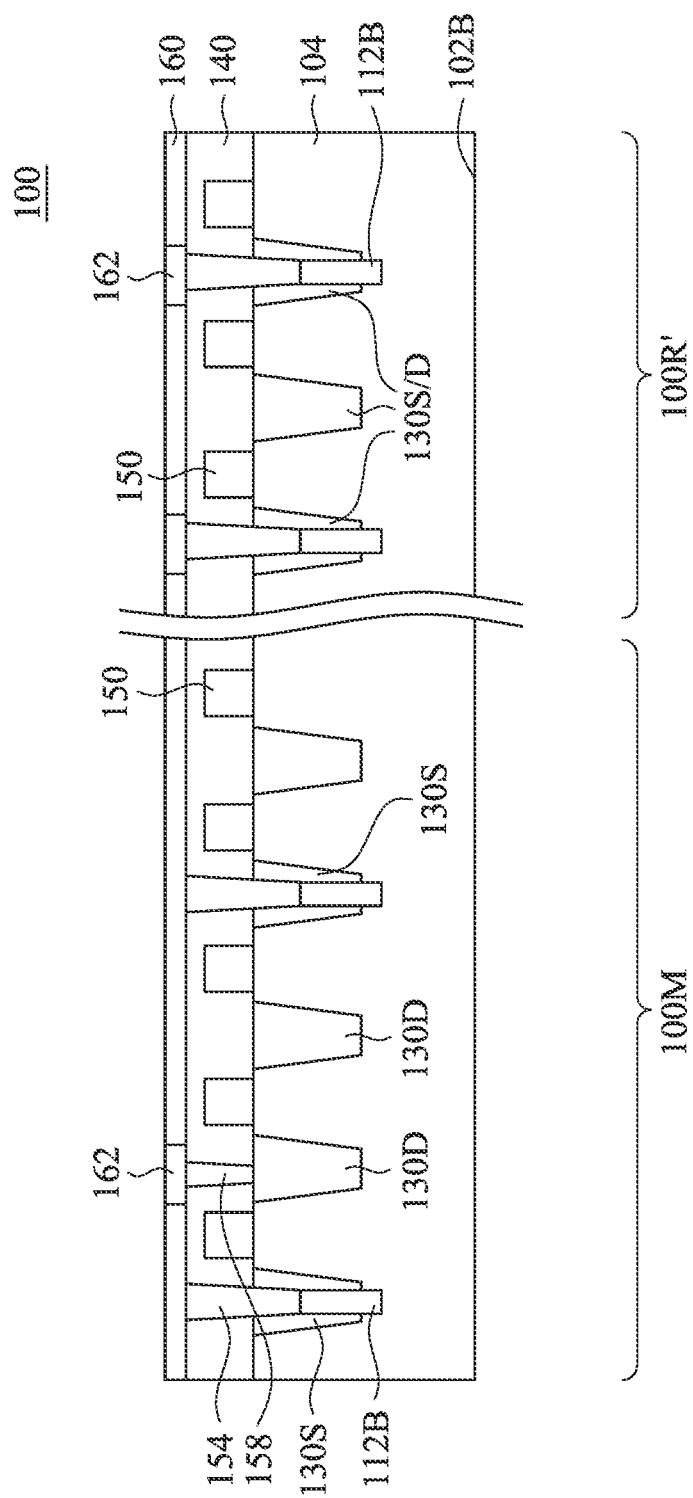

At the stage illustrated in FIGS. 14A, 14B, and 14C, the processes of manufacturing the FEOL portion 100F have been completed. FIGS. 15 to 26 illustrate intermediate stages of manufacturing the BEOL portion 100B and the backside BEOL portion 100BB in cross-sectional views and plan views. In FIGS. 15 and 16 (corresponding to section C-C labeled in FIG. 15), a dielectric layer 160 is formed over the insulating layer 140 (or the dielectric 156, not shown in FIG. 16), and conductive lines 162 are formed in the dielectric layer 160. In some embodiments, some of the conductive lines 162 are physically and electrically connected to respective drain contact plugs 158 in at least the cell region 100M. For example, as illustrated in FIG. 15, the conductive lines 162 may have a plurality of two adjacent columns. One of the adjacent columns of conductive lines 162 is aligned and connected to the drain contact plugs 158 that has a relatively longer length in the Y-direction (i.e., along with the direction of columns), and the other one of the adjacent columns of conductive lines 162 are aligned and connected to the drain contact plugs 158 that has a relatively short length in the Y-direction. According to this arrangement, two adjacent columns of the drain contact plugs 158 may be partially or completely misaligned from each other in the Y-direction (i.e., along with the direction of columns) but may overlap in the X-direction (i.e., perpendicular to the direction of columns). For example, in FIG. 15, the two adjacent columns of the drain contact plugs 158 are completely misaligned in the Y-direction.

The conductive lines 162 may be formed using a suitable technique such as damascene, dual-damascene, plating, deposition, the like, or combinations thereof. In some embodiments, the conductive lines 162 are formed by first depositing the dielectric layer 160 and patterning the dielectric layer 160 to form openings (e.g., using a suitable photolithography and etching process), and filling the openings in the dielectric layer 160 with a barrier layer and a conductive layer. The barrier layer of the conductive lines 162 may be formed of one or more layers of titanium, titanium nitride, tantalum, tantalum nitride, tungsten nitride, ruthenium, rhodium, platinum, other noble metals, other refractory metals, their nitrides, combinations of these, or the like. The conductive layer of the conductive lines 162 may be a metal material such as copper, aluminum, cobalt, alloys thereof, the like, or combinations thereof. The barrier layer or the conductive layer of the conductive lines 162 may be formed using a suitable process such as CVD, PVD, ALD, plating, or the like.

Although not illustrated in the figures, in some embodiments, some of the conductive lines 162 are also physically and electrically connected to the source contact plugs 154 in the routing regions 100R and 100R' for forming vertical routing which providing electrical connections between the BEOL portion 100B and the backside BEOL portion 100BB (e.g., referring to FIG. 24). In some embodiments, when there are one or more dielectric layers (e.g., dielectric layer 156, not shown in FIG. 16) between the dielectric layers 160 and the source contact plugs 154, the one or more dielectric layer are patterned to expose the source contact plugs 154 within the routing regions 100R and 100R' while manufacturing the conductive lines 162. In some embodiments, the conductive lines 162 within the cell region 100M and the conductive lines 162 within the routing regions 100R and 100R' are formed by separate damascene processes. For example, the conductive lines 162 within the cell region 100M may be formed by a single damascene process, and the conductive lines 162 within the routing regions may be formed by a dual damascene process.

Figure 17:
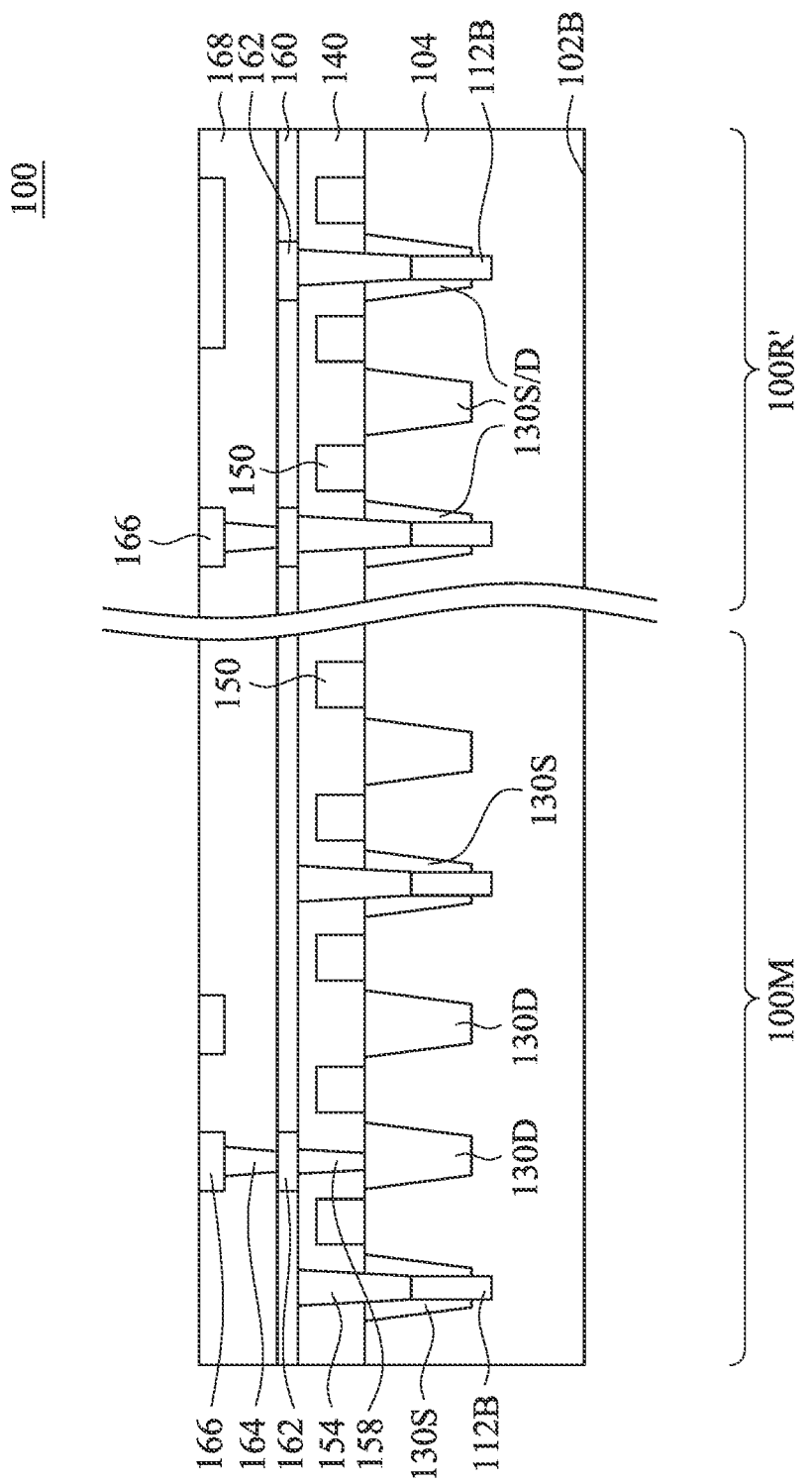

Turning to FIG. 17, one or more levels of vias 164 and conductive lines 166 are formed within a dielectric layer 168 to make electrical connection to the conductive lines 162. In some embodiments, the dielectric layer 168 is first formed over the conductive lines 162 and the dielectric layer 160. The dielectric layer 168 may be formed of a material similar to those described above for the dielectric layer 160 and may be formed using similar techniques. Openings may be formed in the dielectric layer 168 to expose the conductive lines 162 using suitable photolithography and etching processes. Conductive material may fill the openings to form the vias 164 and the conductive lines 166. A planarization process may be used to remove excess conductive material. In some embodiments, the vias 164 and the conductive lines 166 includes a material similar to those described above for the conductive lines 162.

Figure 18:
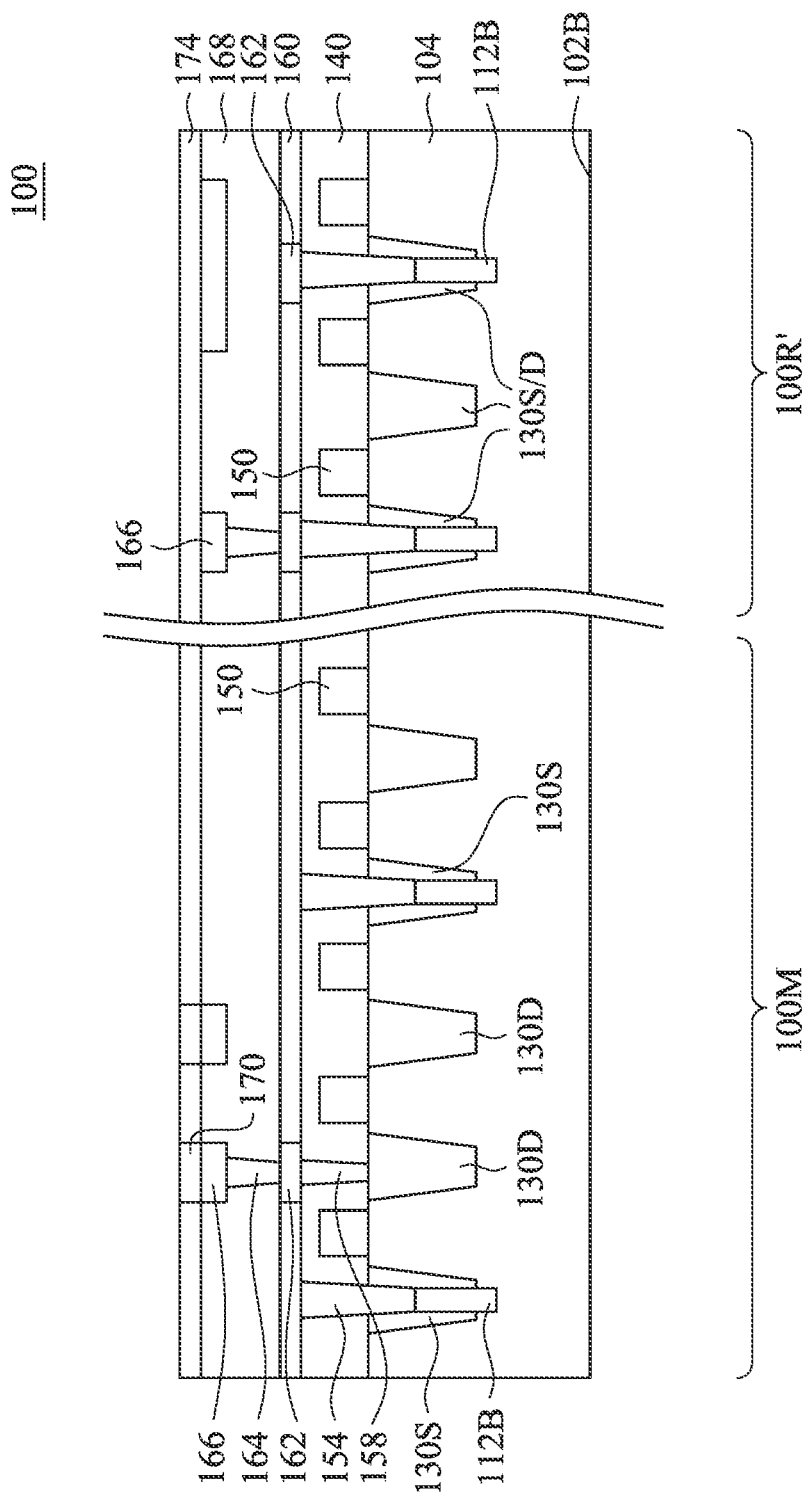

Turning to FIG. 18, bottom electrodes 170 are formed to electrically connect the subsequently formed memory stack 185 (e.g., referring to FIG. 19) to the conductive lines 166. The bottom electrodes 170 may be formed within a dielectric layer 174 that is formed over the dielectric layer 168. The dielectric layer 174 may be formed of a material similar to those described above for dielectric layer 160 and may be deposited using similar techniques as dielectric layer 160.

In some embodiments, the bottom electrodes 170 are formed of multiple layers of material. The material of the bottom electrodes 170 may include Cu, Al, Ti, Ta, W, Pt, Ni, Cr, Ru, Co, $Co_xFe_yB_zW_w$, titanium nitride (TiN), tantalum nitride (TaN), the like, combinations thereof, or multiple layers thereof. For example, the bottom electrodes 170 may include a tantalum nitride layer and a titanium nitride layer formed over the tantalum nitride layer. The material of the bottom electrodes 170 may be deposited using one or more suitable techniques such as CVD, ALD, PVD, sputtering, plating, the like, or combinations thereof.

In some embodiments, the bottom electrodes 170 are formed by first depositing the material of the bottom electrodes 170 as one or more blanket layers over the dielectric layer 168 and the conductive lines 166. The material of the bottom electrodes 170 may then be patterned using, for example, a suitable photolithography and etching process to form the bottom electrodes 170. The dielectric layer 174 may then be deposited over the bottom electrodes 170 and a planarization process performed to expose the bottom electrodes 170.

In some embodiments, the bottom electrodes 170 are formed by first depositing the dielectric layer 174 and patterning the dielectric layer 174 to form openings (e.g., using a suitable photolithography and etching process), and then filling the openings in the dielectric layer 174 with the material of the bottom electrodes 170. In some embodiments, a planarization process such as a CMP process or a grinding process may be performed to remove excess portions of the material of the bottom electrodes 170.

Figure 19:
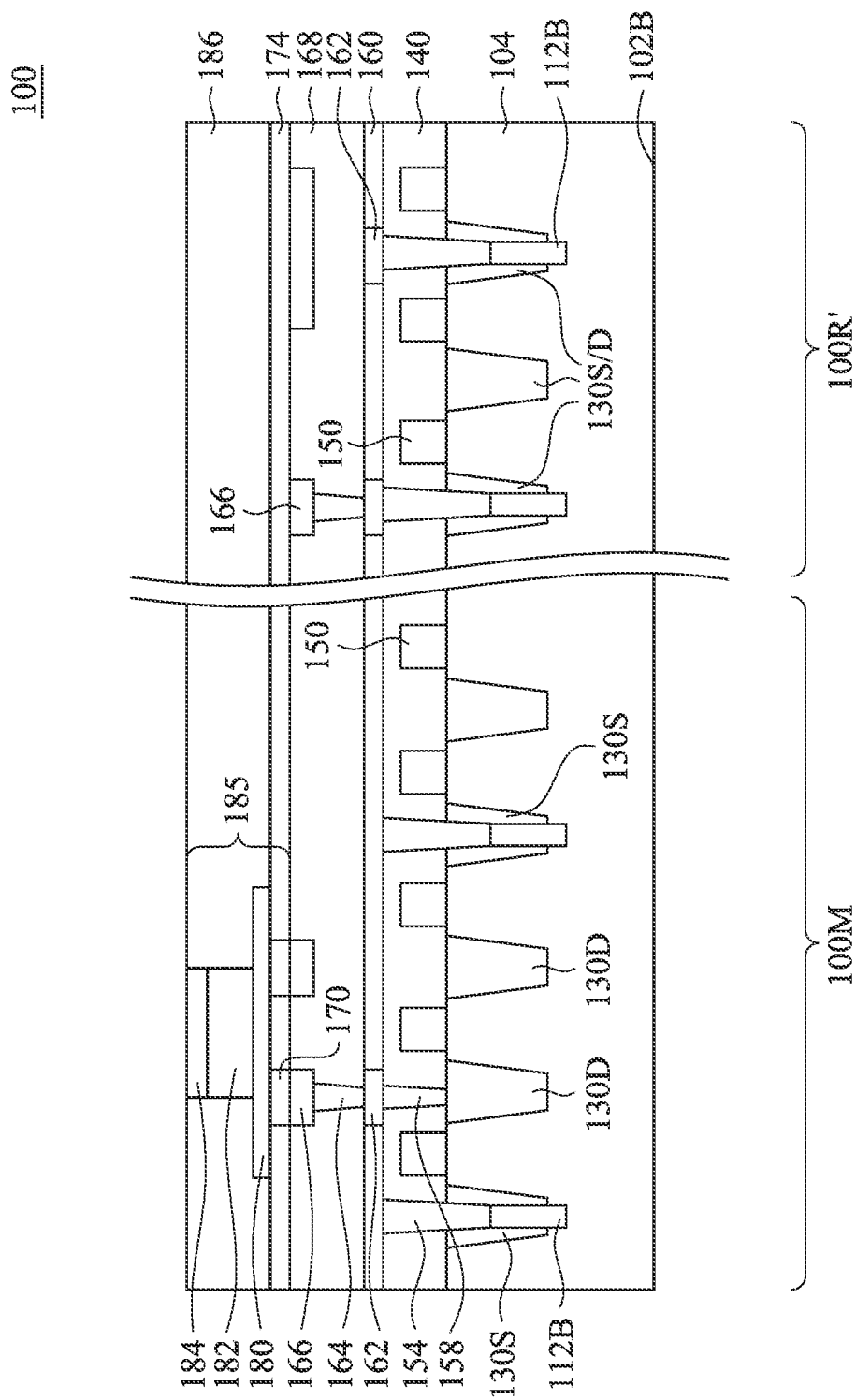

Turning to FIG. 19, the formation of a memory stack 185 in the cell region 100M is shown, in accordance with some embodiments. The memory stack 185 may be a SOT-MRAM stack 185. The SOT-MRAM stack 185 includes multiple layers that provide the magnetic memory functionality of the cells 101 of semiconductor device 100. For example, each cell 101 in the cell region 100M may include one SOT-MRAM stack 185. In some embodiments, the SOT-MRAM stack 185 is formed by depositing multiple layers as blanket layers and then patterning the layers to form the SOT-MRAM stack 185 having the desired shape and configuration. In some embodiments, the layers of the SOT-MRAM stack 185 include a Spin-Orbit Torque (SOT) layer 180, a Magnetic Tunnel Junction (MTJ) stack 182, and a top electrode 184. The SOT layer 180, the MTJ stack 182, and/or the top electrode 184 of the SOT-MRAM stacks 185 may each include one or more layers of one or more materials.

The layers of the SOT-MRAM stack 185 are deposited as blanket layers (see FIG. 26), in accordance with some embodiments. The SOT layer 180 may first be deposited over the dielectric layer 174 and the bottom electrodes 170. The MTJ stack 182 may then deposited over the SOT layer 180, and the top electrode 184 may then deposited over the MTJ stack 182. The SOT layer 180, the MTJ stack 182, and/or the top electrode 184 may be deposited using one or more suitable deposition techniques, depending on the material being deposited. The deposition techniques may include techniques such as CVD, PVD, ALD, sputtering, plating, the like, or a combination thereof.

Figure 26:
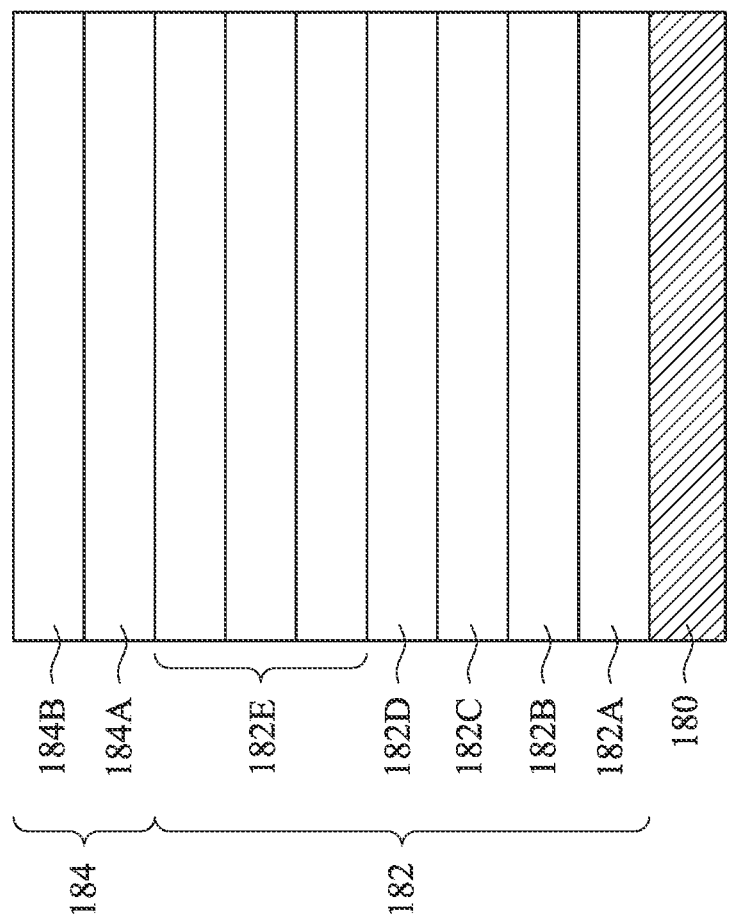

Referring to FIG. 26, the layers deposited to form the SOT layer 180, the MTJ stack 182, and the top electrode 184 of a SOT-MRAM stack 185 are shown, in accordance with some embodiments. The layers of the SOT-MRAM stack 185 described in FIG. 26 are a representative example, and SOT-MRAM stacks, SOT layers, MTJ stacks, or top electrodes having other layers, materials, arrangements, compositions, or dimensions are considered within the scope of the present disclosure.

In some embodiments, the SOT layer 180 is first deposited and makes electrical contact with the bottom electrodes 170. Within a cell 101 in the memory device of the semiconductor device 100, the SOT layer 180 acts as a generator of a spin polarized current. By conducting a current through the SOT layer 180 of the cell 101, spin polarized currents are generated in transverse directions, and these spin polarized currents are used to control the magnetic moment of the overlying free layer 182A of the MTJ stack 182. By forming the SOT layer 180 below the MTJ stack 182 instead of above the MTJ stack 182, the number of process steps may be reduced. For example, additional process steps to form a via adjacent the MTJ stack 182 that connects to the SOT layer 180 are avoided.

In some embodiments, the SOT layer 180 is formed of heavy metal or a metal alloy, such as W, Ta, Pt, AuPt, $W_3Ta$, $Bi_xSe_y$, BiSeTe, multi-layers thereof, alloys thereof, the like, or combinations thereof. The thickness of the SOT layer 180 may be between about 1 nm and about 20 nm, such as about 5 nm. In some cases, the thickness of the SOT layer 180 may be optimized for the composition or other characteristics of the SOT layer 180. For example, the use of a thicker SOT layer 180 can increase the spin polarized current that is generated, but spin diffusion can also reduce the efficiency of thicker SOT layers 180. The amount of spin diffusion in an SOT layer 180 can depend on the spin diffusion length of the material of the SOT layer 180. In this manner, a thickness of the SOT layer 180 can be chosen to maximize the performance of the cell 101 for a given application and a given material used for the SOT layer 180.

The MTJ stack 182 is then formed over the SOT layer 180, which includes a free layer 182A, a barrier layer 182B, a reference layer 182C, a spacer layer 182D, and a Synthetic Anti-Ferromagnetic (SAF) layer 182E in some embodiments. The free layer 182A of the MTJ stack 182 may be deposited over the SOT layer 180. Within the MTJ stack 182 of a cell 101, the free layer 182A acts as a state-keeping layer, and its magnetic state determines the state of the cell 101. For example, the magnetic moment of the free layer 182A is controllable (e.g., by controlling a current flowing in the SOT layer 180), and by controlling the magnetic moment of the free layer 182A in this manner, the resistance of the cell 101 may be put in a high-resistance state or a low-resistance state. Whether the cell 101 is in a high-resistance state or a low-resistance state depends on the relative orientations of the spin polarizations of the free layer 182A and the reference layer 182C. The free layer 182A may be formed of one or more ferromagnetic materials, such as one or more layers of CoFe, NiFe, CoFeB, CoFeBW, Ru, alloys thereof, the like, or combinations thereof. The free layer 182A may include multiple layers of different materials, such as a layer of Ru between two layers of CoFeB, though other configurations of layers or materials may be used. In some embodiments, the material of the free layer 182A includes a crystalline material deposited to have a particular crystalline orientation, such as a (100) orientation. The thickness of the free layer 182A may be between about 0.4 nm and about 4 nm. In some embodiments, a free layer 182A having an in-plane magnetic anisotropy (IMA) may have a thickness between about 1.3 nm and about 4 nm, or a free layer 182A having a perpendicular-to-plane magnetic anisotropy (PMA) may have a thickness between about 0.4 nm and about 1.3 nm. A suitable thickness of the free layer 182A may be determined by the composition of the free layer 182A or the magnetic properties of the free layer 182A.

The barrier layer 182B may be deposited over the free layer 182A. In some embodiments, the barrier layer 182B is formed of one or more materials such as MgO, AlO, AlN, the like, or combinations thereof. In some embodiments, the material of the barrier layer 182B includes a crystalline material deposited to have a particular crystalline orientation, such as a (100) orientation. The material of the barrier layer 182B may be deposited to have the same crystalline orientation as the free layer 182A. In some embodiments, the barrier layer 182B may have a thickness between about 0.6 nm and about 3 nm, such as about 1 nm. In some cases, controlling the thickness of the barrier layer 182B may control the resistance ($R_{MTJ}$) of the MTJ stack 182. For example, a thicker barrier layer 182B may increase the resistance of the MTJ stack 182. In some embodiments, the performance of a cell 101 can be improved by controlling the resistance $R_{MTJ}$ of the MTJ stack 182 to match the parasitic resistance of the circuit(s) connected to the cell 101. In some cases, matching the resistances in this manner can increase the ranges of operating conditions over which the cell 101 can be read. The barrier layer 182B may be thin enough such that electrons are able to tunnel through the barrier layer 182B.

The reference layer 182C may be deposited over the barrier layer 182B. The reference layer 182C may be formed of a ferromagnetic material, such as one or more layers of CoFe, NiFe, CoFeB, CoFeBW, alloys thereof, the like, or combinations thereof. In some embodiments, the material of the reference layer 182C includes a crystalline material deposited to have a particular crystalline orientation, such as a (100) orientation. The material of the reference layer 182C may be deposited to have the same crystalline orientation as the barrier layer 182B. The thickness of the reference layer 182C may be between about 1 nm and about 1.3 nm, in some embodiments. In some cases, controlling the thickness of the reference layer 182C may control the resistance ($R_{MTJ}$) of the MTJ stack 182. For example, a thicker reference layer 182C may increase the resistance of the MTJ stack 182. The thickness of the reference layer 182C may be controlled in this manner to match the resistance $R_{MTJ}$ of the MTJ stack 182 to the parasitic resistance of the associated circuit, as described previously.

The spacer layer 182D may be deposited over the reference layer 182C. In some embodiments, the spacer layer 182D is formed of a material such as W, Mo, the like, or combinations thereof. In some embodiments, the spacer layer 182D may have a thickness between about 2 Å and about 1 nm. In some embodiments, a thicker spacer layer 182D may be used to reduce the effects of crystalline lattice mismatch on the reference layer 182C or free layer 182A from overlying layers. The spacer layer 182D may be thin enough such that electrons are able to tunnel through the spacer layer 182D.

The Synthetic Anti-Ferromagnetic (SAF) layer 182E may be formed over the spacer layer 182D. The SAF layer 182E is used to pin the spin polarization direction of the reference layer 182C in a fixed direction. Pinning the spin polarization direction of the reference layer 182C allows the cell 101 to be toggled between a low-resistance state and a high-resistance state by changing the spin polarization direction of the free layer 182A relative to the reference layer 182C.

The SAF layer 182E may include multiple layers of different materials, in some embodiments. For example, the SAF layer 182E may comprise a stack of one or more ferromagnetic layers and one or more non-magnetic layers. For example, the SAF layer 182E may be formed from a non-magnetic layer sandwiched between two ferromagnetic layers or a stack of alternating non-magnetic layers and ferromagnetic layers. The ferromagnetic layers may be formed of a material such as Co, Fe, Ni, CoFe, NiFe, CoFeB, CoFeBW, alloys thereof, the like, or combinations thereof. The non-magnetic layers may be formed of a material such as Cu, Ru, Ir, Pt, W, Ta, Mg, the like, or combinations thereof. In some embodiments, the ferromagnetic layer(s) of the SAF layer 182E may have a thickness between about 1 nm and about 3 nm. In some embodiments, a thicker SAF layer 182E may have stronger antiferromagnetic properties, or may be more robust against external magnetic fields or thermal fluctuation. In some embodiments, the non-magnetic layer(s) of the SAF layer 182E may have a thickness between about 2 Å and about 1 nm. For example, the SAF layer 182E may include a layer of Ru that has a thickness of about 0.4 nm or about 0.85 nm, though other layers or thicknesses are possible. In some embodiments, one or more layers of the SAF layer 182E includes a crystalline material deposited to have a particular crystalline orientation, such as a (111) orientation.

The top electrode 184 may include one or more layers deposited over the MTJ stack 182 to protect the MTJ stack 182 and provide electrical connection to the top of the MTJ stack 182. For example, the top electrode 184 may include one or more layers deposited over the SAF layer 182E of the MTJ stack 182, as shown in FIG. 26. The top electrode 184 may include one or more layers of materials such as Cu, Al, Ti, Ta, W, Pt, Ni, Cr, Ru, Co, Zr, titanium nitride (TiN), tantalum nitride (TaN), the like, combinations thereof, or multiple layers thereof. For example, the top electrode 184 may include a Ru layer 184A and a Ta layer 184B formed over the Ru layer. In some embodiments, the top electrode 184 may have a thickness between about 1 nm and about 5 nm, such as about 4 nm. For example, the top electrode 184 may include a Ru layer having a thickness of about 2 nm and a Ta layer having a thickness of about 2 nm that is formed over the Ru layer. In other embodiments, the top electrode 184 may include different layers and/or layers of different thicknesses than this example. In some cases, the top electrode 184 may be considered a "capping layer," or one or more layers within the top electrode 184 may be considered "capping layers."

In some embodiments after SOT layer 180, the MJT stack 182 and the top electrode 184 are deposited, a first patterning process is performed to pattern the SOT layer 180, the MTJ stack 182, and the top electrode 184 to a first shape. The first patterning process may include a suitable photolithography and etching process. In some embodiments, the pattern etched in the SOT layer 180 by the first patterning process defines the shape, size, or lateral dimensions of the SOT layer 180 of each cell 101. For example, each cell 101 may include a SOT layer 180 having a length between about 50 nm and about 500 nm and a width between about 10 nm and about 100 nm. In some embodiments, the SOT layer 180 may have an area between about 500 nm² and about 50000 nm².

Afterwards, a second patterning process is performed to pattern the MTJ stack 182 and the top electrode 184, forming the SOT-MRAM stack 185. The second patterning process may include a suitable photolithography and etching process. In some embodiments, the SOT layer 180 is used as an etch stop layer. In this manner, the second patterning process reshapes the MTJ stack 182 and the top electrode 184 to have the desired shape and size over the SOT layer 180. As shown in FIG. 19, the second patterning process etches the MTJ stack 182 and the top electrode 184 such that the MTJ stack 182 and the top electrode 184 have a smaller lateral area than the SOT layer 180. The resulting shape of the MTJ stack 182 and top electrode 184 may have an approximately circular shape, or may have an oblong shape, such an elliptical shape, rounded rectangle shape, or the like.

Figure 20:
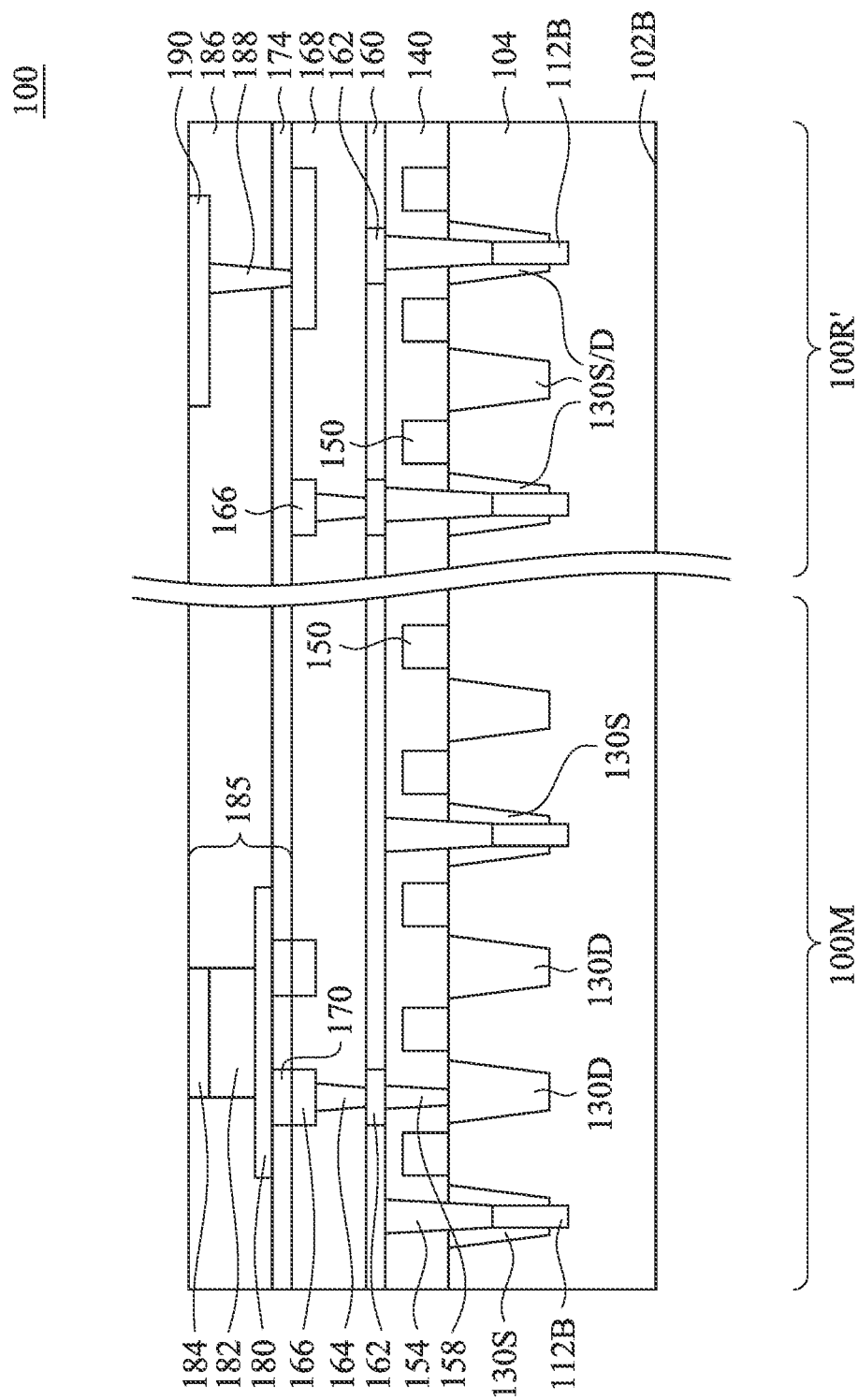

Turning to FIG. 20, after the SOT-MRAM stack 185 is formed, vias 188 and conductive lines 190 are formed in the dielectric layer 186 and the dielectric layer 168 in the routing regions 100R and/or 100R' to make electrical connection with the conductive lines 166 and make the vertical routing in the routing regions 100R and/or 100R'. In some embodiments, the vias 188 and the conductive lines 190 are formed by a dual damascene process. The conductive lines and the vias 188 may be formed of a material similar to those described above for conductive lines 162.

Figure 21:
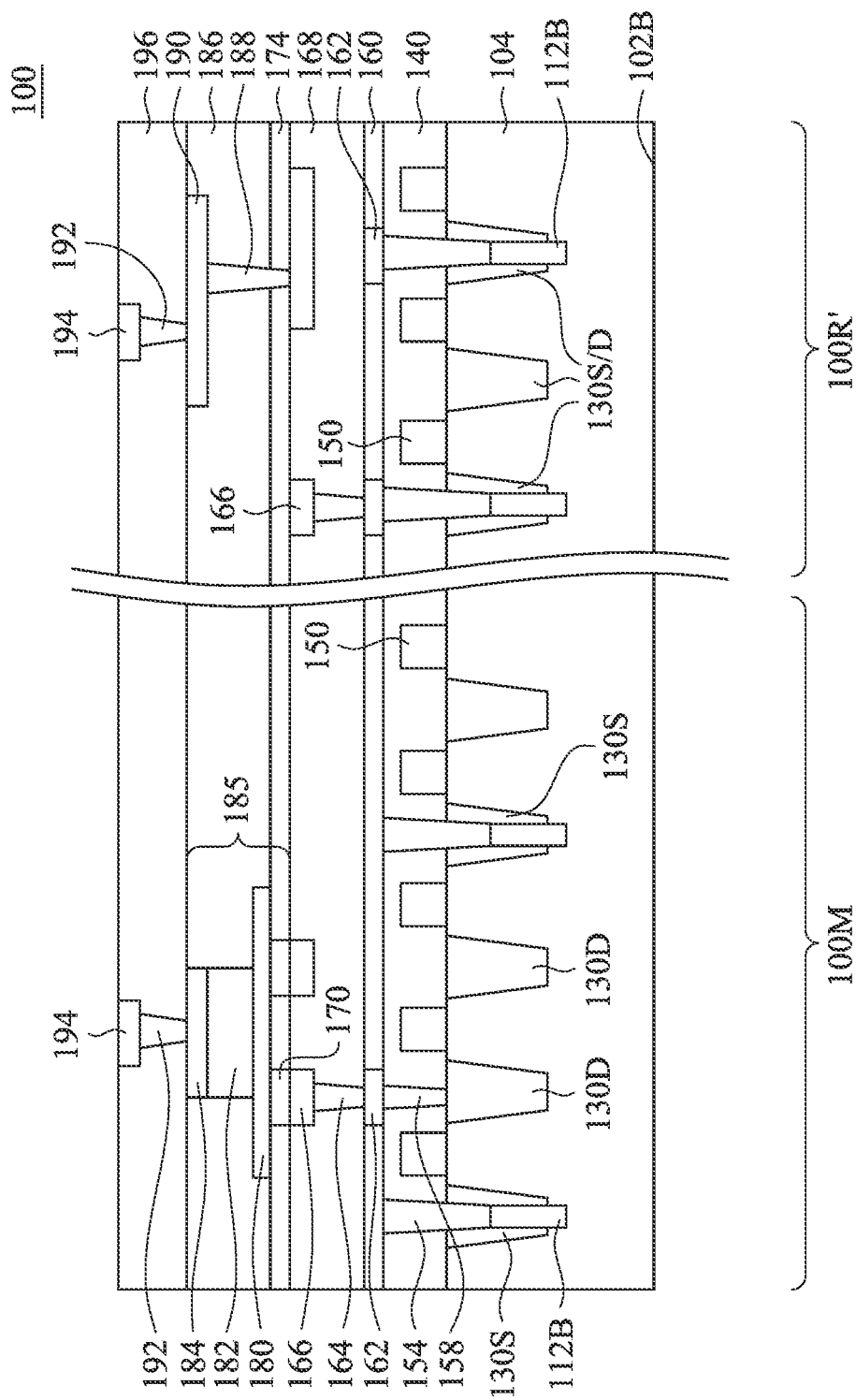

In FIG. 21, vias 192 and conductive lines 194 are formed in a dielectric layer 196 to make electrical connection to the top electrodes 184 in the cell region 100M and make electrical connection to the conductive lines 190 in the routing regions 100R and/or 100R', in accordance with some embodiments. In some embodiments, the dielectric layer 196 may have one or more layers. The dielectric layer 196 may be formed of a material similar to those described above for the dielectric layer 160 and may be formed using similar techniques. The vias 192 and the conductive lines 196 may be formed of a material similar to those described above for the vias 164 and the conductive lines 166 and may be formed using similar techniques. In some embodiments, some of the conductive lines 194 in the cell regions 100M are used as a Read Bit Lines ("RBL") for each cell 101 of the memory device of the semiconductor device 100.

One or more sets of additional vias and conductive lines (not shown in Figures) may be formed over the conductive lines 194 and the dielectric layers 196 in accordance with some embodiments. The additional sets of vias and conductive lines may be formed in a similar manner as the vias 164 and conductive lines 166. In some embodiments, bonding pads and bumps (not shown in Figures) are also formed over the additional sets of vias and conductive lines to complete the BEOL portion 100B.

Figure 22:
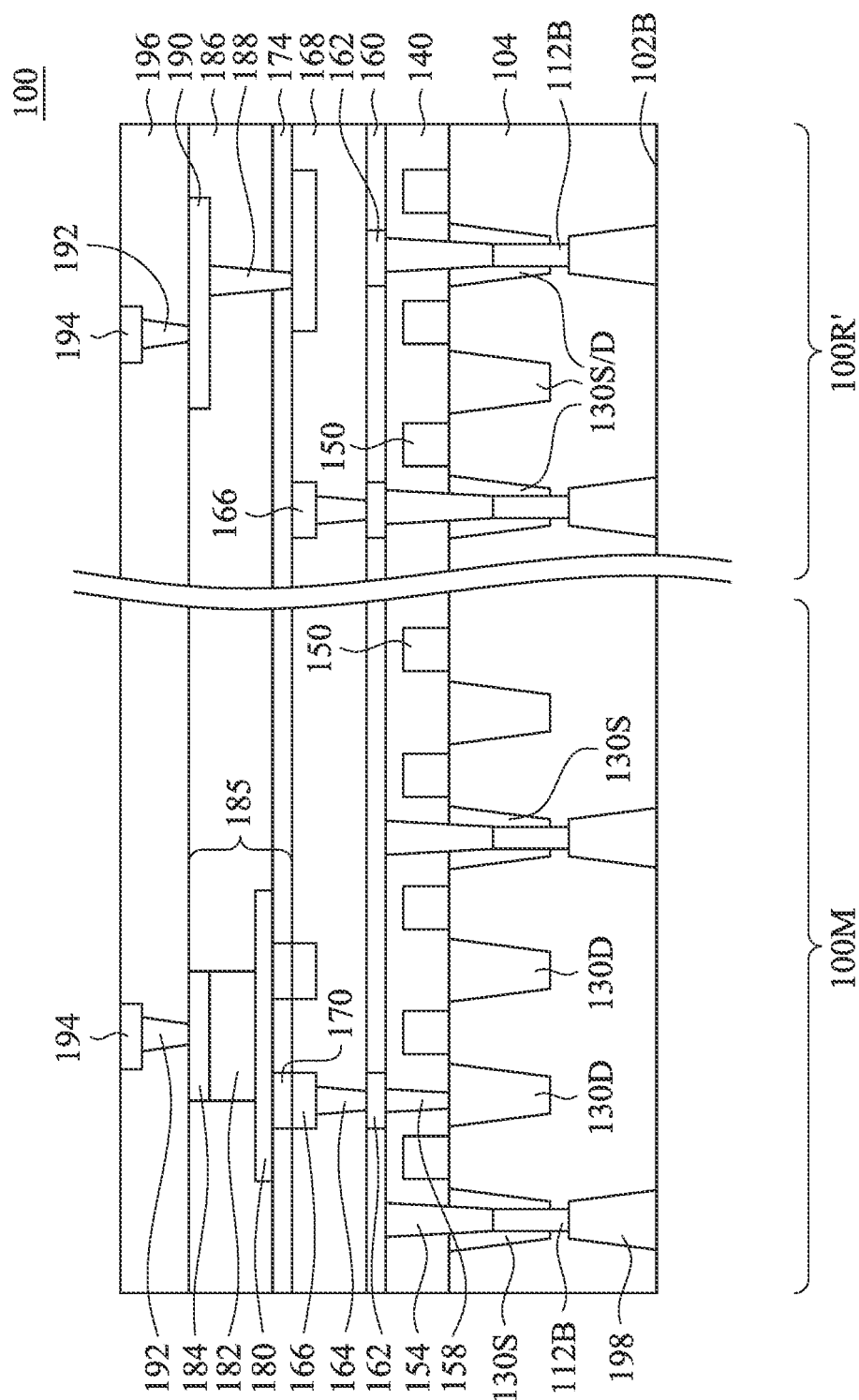

Turning to FIG. 22, through substrate vias 198 are formed in the substrate 102 and physically and electrically connect to the buried contacts 112B. In some embodiments, the through substrate vias 198 physically and electrically connect to the buried contacts 112A underlying the gate electrode 150 (e.g., referring to FIG. 25). The vias (sometimes referred to as through silicon vias or through substrate vias) 198 may be formed by a drilling process, such as a laser drilling process or a mechanical drilling process, from the second side 102B of the substrate 102. The drilling process forms through holes that expose the buried contacts 112A and 112B. A conductive material is then filled into through holes. Excess conductive material over the second side 102B of the substrate 102 is removed by a planarizing process such as CMP or a grinding process. Because the buried contacts 112A and 112B have a bottom lower than the bottom of the protrusions 104 and first side 102A of the substrate 102, the tolerance of forming the thorough substrate vias 198 is increased, which may prevent features formed over the first side 102A of the substrate 102 from being harmed during the formation of the through substrate vias 198. In some embodiments, the through substrate vias 198 may be formed of a material similar to those described above for the vias 164. In some embodiments, the buried contacts 112A and 112B have a portion protruding into the through substrate vias 198.

Figure 23:
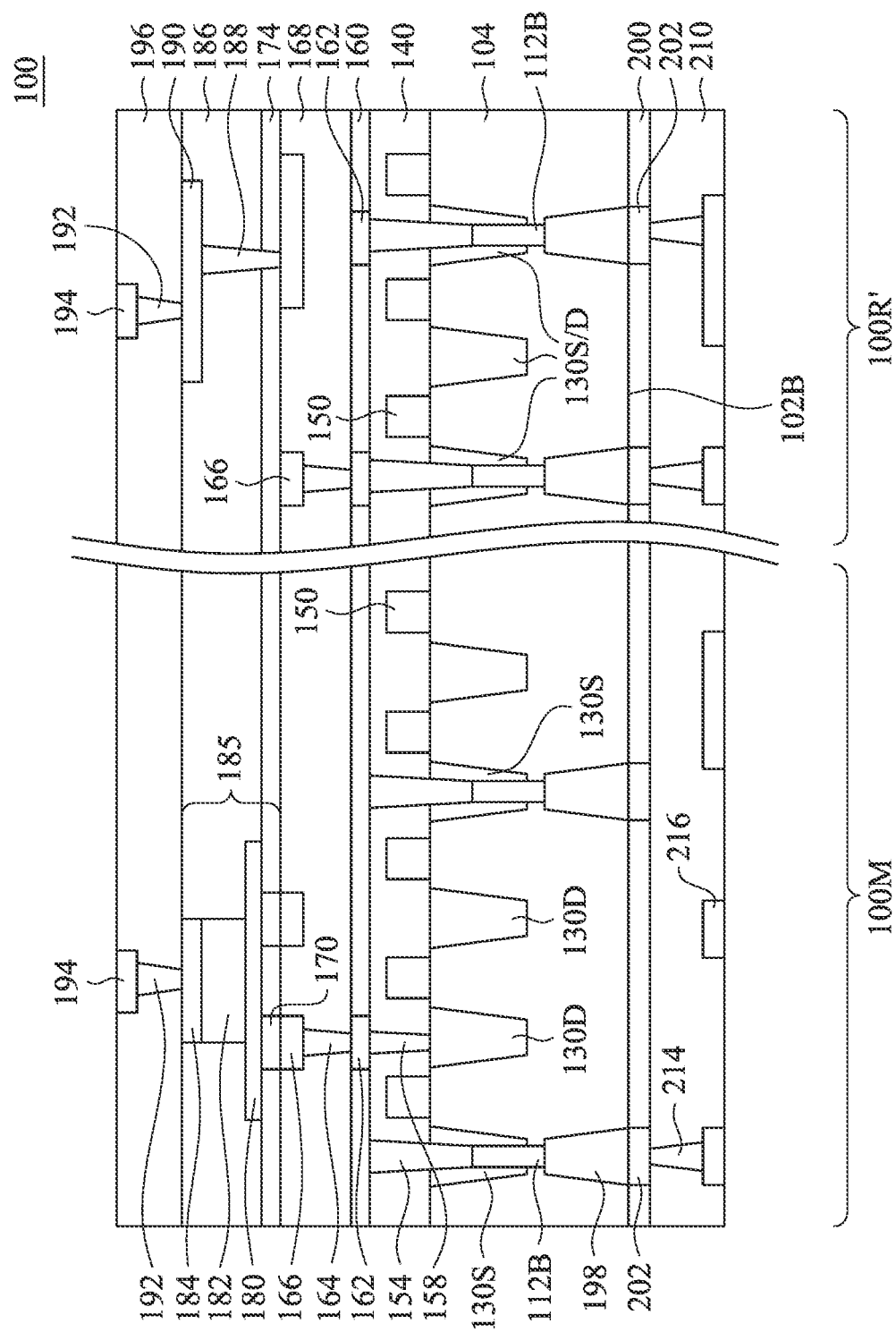

Turning to FIG. 23, one or more level of backside conductive lines is formed. For example, as illustrated in FIG. 23, two levels of conductive lines 202 and 216 are formed. Conductive lines 202 are formed in a dielectric layer 200. Vias 214 and conductive lines 216 are formed in a dielectric layer 210. In some embodiments, at least some of the conductive lines 202 and/or at least some of the conductive lines 216 are electrically connected to the buried contacts 112B by the through substrate vias 198. By making electrical connection to the buried contacts 112B and source features 130S of transistors 130, at least a portion of the conductive lines 200 and/or a least a portion of the conductive lines 216 act as source lines configured to operate the SOT-MRAM stack 185, in accordance with some embodiments. Referring to FIG. 25, at least some of the conductive lines 202 and/or at least some of the conductive lines 216 are electrically connected to the buried contacts 112A underlying the gate structure 150 by the through substrate vias 198. By making electrical connection to the buried contacts 112A and gate structure 150 of transistors 130, at least a portion of the conductive lines 202 and/or a least a portion of the conductive lines 216 act as word lines configured to operate the SOT-MRAM stack 185, in accordance with some embodiments. In some embodiments, at least a portion of the backside conductive lines 202 act as the source lines configured to operate the SOT-MRAM stack 185, and at least a portion of the backside conductive lines 216 act as the word lines configured to operate the SOT-MRAM stack 185, or vice versa. Although FIG. 23 only shows (portions of) the cell region loots and routing regions 100R', a person skilled in the art would know that the backside conductive lines 202 and 216 are not limited to be disposed in the regions described above. For example, the backside BEOL 100BB may occupy similar areas as FEOL portion 100B and the BEOL portion 100F. In some embodiments, the backside conductive lines 202 and 216 may be disposed in or across to other regions, such as logic regions or other routing regions such as the routing region 100R.

In some embodiment, the arrangement of the source features and the drain features are not limited to the arrangement of the source/drain features as illustrated in the cell region 100M. The buried contacts 112B are not limited to connect to the source features 130S of transistors 130 in accordance with some embodiments. For example, the buried contacts 112B may be formed adjacent to source features, drain features, or a combination thereof in routing regions 100R, 100R' or other regions of the semiconductor device 100. In other words, in alternative embodiments, buried contacts 112B may be used to make electrical connections to drain features 130D, and contact plugs 154 may be used to make electrical connections to source features 130S. In still other embodiments, buried contacts may be employed to connect to both source features 130S and drain features 130D, and contact plugs may be employed to electrically connect to other source features 130S and drain features 130D.

Turning to FIG. 24, a passivation layer is formed over the dielectric layer 210 and the conductive lines 216 to protect the backside conductive lines from being damaged by moisture. The passivation layer 220 may include silicon nitride, silicon oxynitride, aluminum oxide, aluminum nitride, or a combination thereof. The passivation 220 may be formed by CVD, PVD, or by spin on.

Figure 27:
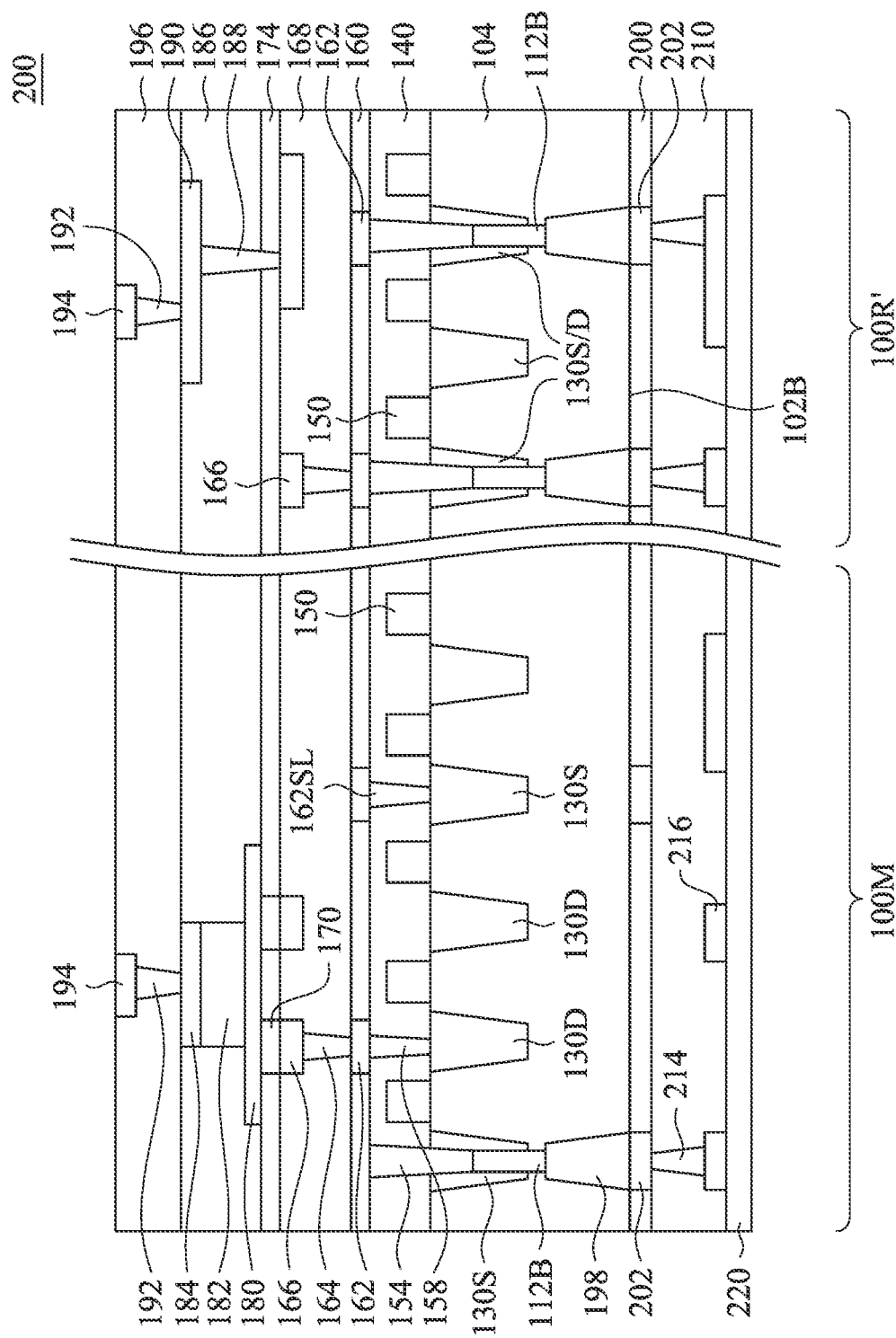
FIGS. 27-29 illustrate the cross-sectional views and plan views of intermediate stages in the formation of a semiconductor device in accordance with some embodiments.
Figure 28:
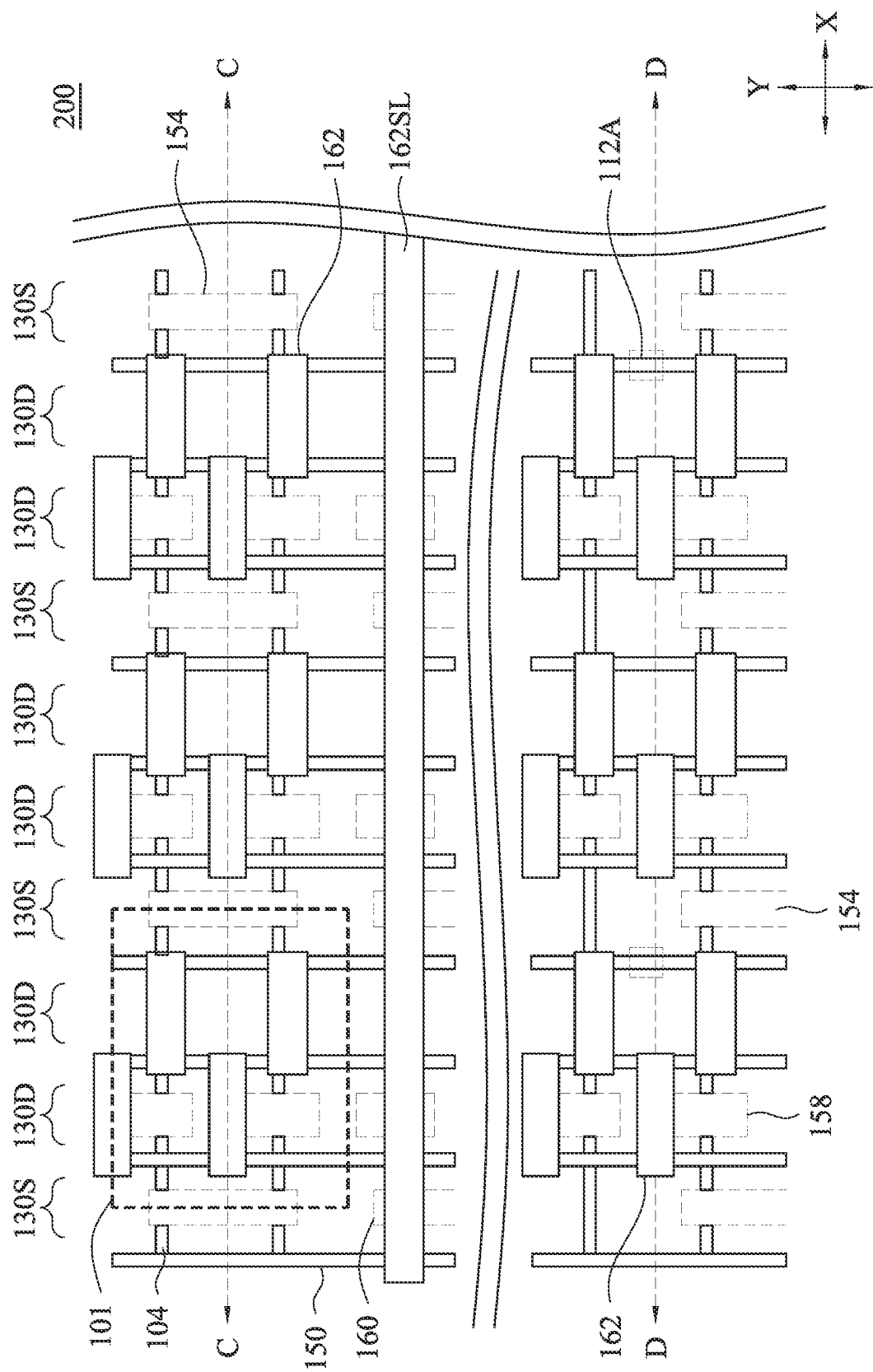
Figure 29:
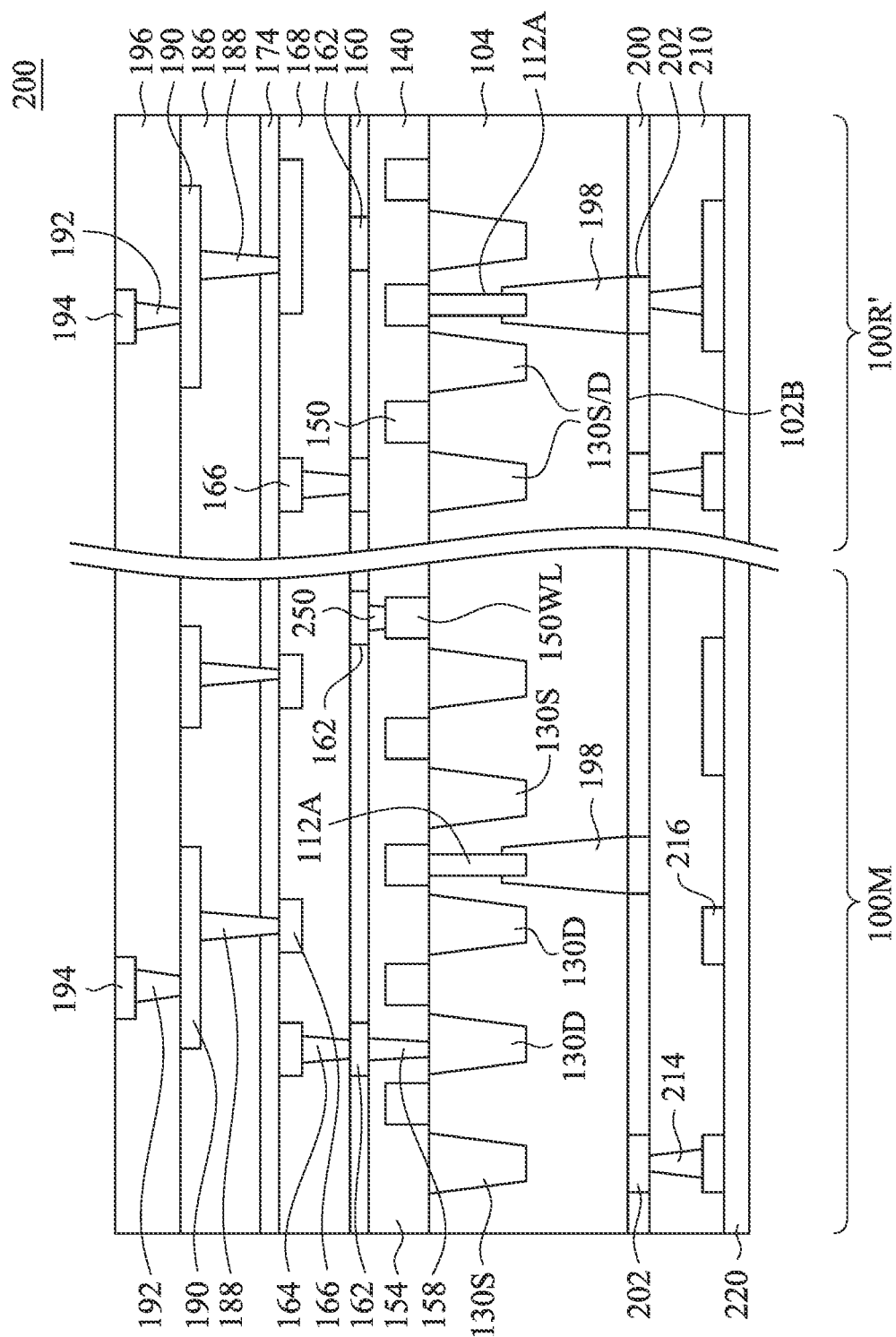
Figure 30:
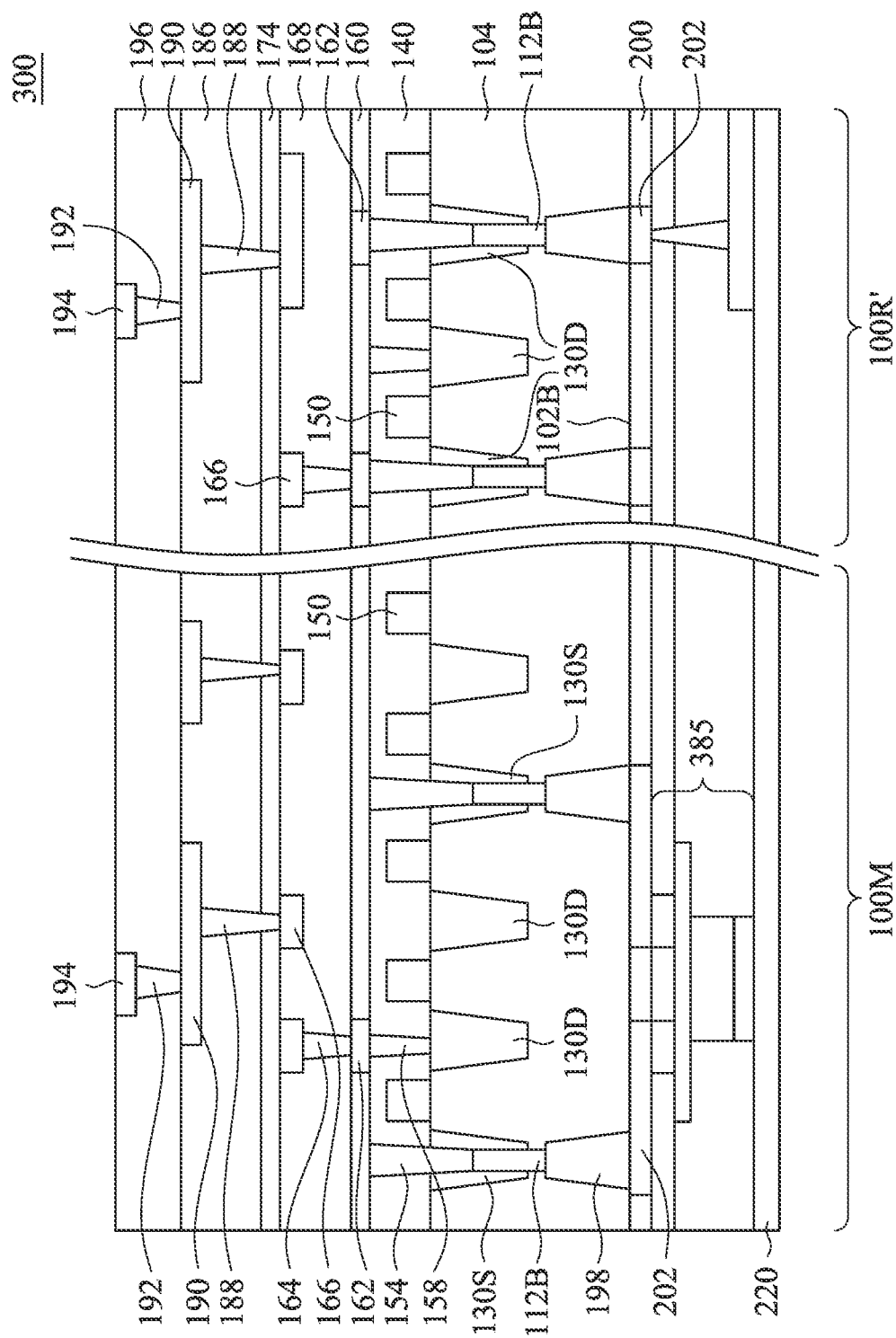
FIG. 30 illustrates the cross-sectional views of intermediate stages in the formation of SOT-MRAM devices in accordance with some embodiments.

FIGS. 27 to 29 illustrate immediate stages in the formation of the semiconductor device 200 in accordance with another embodiment of the present disclosure in cross-sectional and plan views. In FIGS. 27 and 28 (FIG. 27 corresponding to section C-C labeled in FIG. 28), a semiconductor device 200 is illustrated. The semiconductor device 200 is the same as the semiconductor device wo except that only a portion of source lines are disposed in the backside BEOL portion 100BB, and some of the conductive lines 162 (label as "162SL") act as source lines configured to operate the SOT-MRAM stack 185. In the semiconductor device 200, word lines configured to operate the SOT-MRAM stack 185 may be disposed in the BEOL portion 100B, the backside BEOL portion 100BB, or a combination thereof. For example, referring to FIG. 29 (corresponding to section D-D labeled in FIG. 28), some of the gate structure 150 (labeled as "150WL") acts as a part of the word lines configured to operate the SOT-MRAM stack 185 and electrically connected to the conductive lines 162 by vias 250, and the word lines (e.g., conductive lines 202 or conductive line 216) configured to operate the SOT-MRAM stack 185 are extended to conductive lines 202 and/or 216 in the backside BEOL portion 100BB by buried contacts 112A and through substrate vias 198. In FIG. 30, a semiconductor device 300 is illustrated. The semiconductor device 300 is the same as the semiconductor device 100 or 200 except the SOT-MRAM stack 385 is disposed in the backside BEOL portion 100BB. The SOT-MRAM stack 385 may be electrically connected to the source feature 130S of transistors 130 by the conductive lines 202, through substrate vias 198, buried contacts 112B, and buried contact plugs 154. The SOT-MRAM stack 385 may be electrically connected to the gate structure 150 of transistors by the conductive lines 202, through substrate vias 198, and buried contacts 112A. In some embodiments, the SOT-MRAM stack 385 is electrically connected to the drain features 130D of transistors 130 by the vertical routing in the routing regions 100R' and conductive lines 162. Alternatively, the SOT-MRAM stack 385 may be electrically connected to the drain features 130D of transistors 130 by buried contacts adjacent to the drain features and making electrical connection to the drain regions in a manner similar to the source regions.

The embodiments of the present disclosure have some advantageous features. For example, the semiconductor device 100, 200, or 300 of the present disclosure provides conductive lines (i.e., interconnection structure of BEOL) formed over both sides of the substrate, which provides more flexibility of routing designs. In some cases, when the pitch of the drain contact plugs is too small, device designers or manufactures may have a problem to dispose the conductive lines that are used to electrically connect the underlying drain contact plugs because, at the first level of BEOL, most of the space is occupied by the conductive lines acting as source lines of the memory device. According to some embodiments of the present disclosure, by moving at least a portion of source lines would create space to dispose the conductive lines that are used to electrically connect the underlying drain plugs. For example, adjacent columns of the conductive lines (e.g., the conductive lines 162) may be partially or completely misaligned in a direction of the columns. Alternatively, adjacent columns of the conductive lines (e.g., the conductive lines 162) may partially overlap in a direction perpendicular to the direction of columns. Additionally, the backside BEOL provides extra space to integrate more embedded devices, in accordance with some embodiments of the present disclosure.

In an embodiment, a device includes a substrate having a first side and a second side; and a memory device that includes: a transistor disposed over the first side of the substrate, wherein the transistor includes a gate and a source feature and a drain feature interposing the gate; first conductive lines disposed over the transistor; a memory stack disposed over the first conductive lines; and second conductive lines disposed over the second side of the substrate, wherein at least one of the second conductive lines is a source line or a word line of the memory device.

In an embodiment, a device includes a substrate having a first side and a second side; a first transistor, wherein the first transistor comprises a first gate over a first protrusion and a first source region and a first drain region interposing the first protrusion; a first buried contact disposed adjacent to the first protrusion and having at least a portion extending into the substrate, wherein the first buried contact is electrically connecting to the first source region or the first gate; a first contact plug disposed over the first drain region; first conductive lines disposed over the first contact plug and electrically connecting to the first drain region by the first contact plug; a first via penetrating through the substrate and connecting to the first buried contact; and second conductive lines disposed over the second side of the substrate and electrically connecting to the first via.

In an embodiment, a device includes a substrate having a first side and a second side; and a memory device that includes: a transistor disposed over the first side of the substrate, wherein the transistor includes a gate and a source feature and a drain feature interposing the gate; first conductive lines disposed over the transistor; a memory stack disposed over the first conductive lines; and second conductive lines disposed over the second side of the substrate, wherein at least one of the second conductive lines is a source line or a word line of the memory device.

In an embodiment, a method includes: forming a protrusion over a side of a substrate; forming a buried contact adjacent to the protrusion, wherein the buried contact has a portion extending into the substrate; forming a gate wrapping over the protrusion; forming epitaxial features interposing protrusions, wherein the gate or the epitaxial features is electrically connected to the buried contact; forming first conductive lines over the gate and the epitaxial features; forming a via penetrating through the substrate and connecting to the buried contact; and forming second conductive lines over another side of the substrate, wherein the second conductive lines are electrically connected to the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate having a first side and a second side; and
a memory device, comprising:
a transistor disposed over the first side of the substrate, wherein the transistor comprises a gate and a source feature and a drain feature interposing the gate;
first conductive lines disposed over the transistor;
a memory stack disposed over the first conductive lines; and
second conductive lines disposed over the second side of the substrate, wherein at least one of the second conductive lines is a source line or a word line of the memory device.

2. The device of claim 1, wherein the memory stack comprises a magnetic tunnel junction layer and a spin orbital torque layer.

3. The device of claim 1, wherein the transistor comprises a fin field-effect transistor or a gate-all-around field-effect transistor.

4. The device of claim 1, wherein the gate is a word line of the memory device.

5. The device of claim 1, wherein at least one of the first conductive lines is a source line of the memory device.

6. A device comprising:

a substrate having a first side and a second side;

a first transistor disposed on the first side, wherein the first transistor comprises a first gate over a first protrusion, and a first source feature and a first drain feature on respective sides of the first gate;

a first buried contact disposed adjacent to the first protrusion and having at least a portion extending into the substrate, wherein the first buried contact is electrically connecting to the first source feature or the first gate;

first conductive lines disposed over the first transistor;

a memory stack of a memory device, the memory stack electrically connected to the first transistor; and second conductive lines disposed over the second side of the substrate, wherein at least one of the second conductive lines is a source line or a word line of the memory device.

7. The device of claim 6, further comprising:

a first contact plug disposed over the first drain feature, the first contact plug electrically connecting the first drain feature and at least one of the first conductive lines.

8. The device of claim 6, further comprising:

a first via penetrating through the substrate and connecting to the first buried contact.

9. The device of claim 8, wherein the first via electrically connects the second conductive lines to the first buried contact.

10. The device of claim 6, wherein the device has a cell region and a routing region, and the first transistor and the memory stack are disposed in the cell region.

11. The device of claim 10, further comprising:

a second transistor disposed in the routing region, wherein the second transistor comprises a second gate interposed between a second source feature and a second drain feature, wherein the second transistor is electrically connected to the first transistor by at least the second conductive lines.

12. The device of claim 11, further comprising a third contact plug disposed over the second source feature or the second drain feature and electrically connecting the second source feature or the second drain feature to the first conductive lines.

13. The device of claim 11, further comprising:

a second buried contact having a portion extending into the substrate and electrically connected to the second source feature, the second drain feature, or a combination thereof.

14. The device of claim 13, further comprising a fourth contact plug disposed over the second source feature or the second drain feature when the second buried contact is electrically connected to the one of the second source feature and the second drain feature, wherein the fourth contact plug is electrically connected the one of the second source feature and the second drain feature to the second buried contact; and a second via penetrating through the substrate and connecting to the second buried contact, wherein the second via is electrically connected to the second conductive lines.

15. The device of claim 6, wherein the first conductive lines are arranged in two adjacent columns that columns are misaligned to each other in a direction along the columns.

16. The device of claim 6, wherein the first conductive lines are arranged in two adjacent columns, wherein the two adjacent columns partially overlap in a direction perpendicular to the columns.

17. The device of claim 6 wherein the memory stack is disposed over the first conductive lines.

18. The device of claim 8, wherein the memory stack is disposed over the second side of the substrate, and wherein the memory stack is electrically connected to the first transistor at least by the first buried contact and the first via.

19. A device comprising:

a substrate having a first side and a second side; and a memory device, comprising:

a transistor disposed over the first side of the substrate, wherein the transistor comprises a gate and a source feature and a drain feature interposing the gate;

first conductive lines disposed over the transistor;

a magnetic tunnel junction memory stack disposed over the first conductive lines; and second conductive lines disposed over the second side of the substrate, wherein at least one of the second conductive lines is a source line or a word line of the memory device.

20. The device of claim 19, wherein the magnetic tunnel junction memory stack includes a pinning layer, a pinned layer over the pinning layer, a tunnel layer over the pinned layer, and a free layer over the tunnel layer.

* * * * *

UNITED STATES PATENT AND TRADEMARK OFFICE
CERTIFICATE OF CORRECTION

| | | |
|---|---|---|
| PATENT NO. | : 11,723,218 B2 | Page 1 of 1 |
| APPLICATION NO. | : 17/216162 | |
| DATED | : August 8, 2023 | |
| INVENTOR(S) | : Lin et al. | |

It is certified that error appears in the above-identified patent and that said Letters Patent is hereby corrected as shown below:

On the Title Page

Item (72), in Column 1, in "Inventors", Line 3, delete "Mingyuan" and insert -- MingYuan --.

In the Claims

In Column 20, in Claim 14, Line 11, delete "connected the" and insert -- connected to the --.

Signed and Sealed this
Twenty-fourth Day of October, 2023

Katherine Kelly Vidal
*Director of the United States Patent and Trademark Office*